US012562682B2

(12) United States Patent
Escarra et al.

(10) Patent No.: US 12,562,682 B2
(45) Date of Patent: Feb. 24, 2026

(54) HYBRID RECEIVER FOR CONCENTRATED PHOTOVOLTAIC-THERMAL POWER SYSTEMS, AND ASSOCIATED METHODS

(71) Applicant: THE ADMINISTRATORS OF THE TULANE EDUCATIONAL FUND, New Orleans, LA (US)

(72) Inventors: Matthew David Escarra, New Orleans, LA (US); Luke Artzt, New Orleans, LA (US); Yaping Ji, New Orleans, LA (US); Daniel Codd, New Orleans, LA (US); Matthew Barrios, New Orleans, LA (US); Kazi M. Islam, New Orleans, LA (US); David M. Bar-Or, New Orleans, LA (US); Jacqueline C Failla, New Orleans, LA (US); Claire C. Davis, New Orleans, LA (US); Maxwell W. Woody, New Orleans, LA (US)

(73) Assignee: THE ADMINISTRATORS OF THE TULANE EDUCATIONAL FUND, New Orleans, LA (US)

( * ) Notice: Subject to any disclaimer, the term of this patent is extended or adjusted under 35 U.S.C. 154(b) by 0 days.

(21) Appl. No.: 18/745,582

(22) Filed: Jun. 17, 2024

(65) Prior Publication Data

US 2024/0339964 A1     Oct. 10, 2024

Related U.S. Application Data

(62) Division of application No. 17/619,185, filed as application No. PCT/US2020/037663 on Jun. 14, 2020, now Pat. No. 12,015,378.

(Continued)

(51) Int. Cl.
H02S 40/44        (2014.01)
F24S 10/70        (2018.01)
(Continued)

(52) U.S. Cl.
CPC ............ *H02S 40/44* (2014.12); *F24S 10/744* (2018.05); *F24S 20/20* (2018.05); *F24S 70/65* (2018.05);
(Continued)

(58) Field of Classification Search
CPC ...... H02S 40/44; H02S 40/425; F24S 10/744; F24S 20/20; F24S 70/65; F24S 23/72;
(Continued)

(56) References Cited

U.S. PATENT DOCUMENTS 4,173,968 A      11/1979  Steward
4,258,698 A *    3/1981   Sales ...................... F03G 6/071
                                                        126/700
(Continued)

FOREIGN PATENT DOCUMENTS

CN        106059490 A      10/2016
GB          2513109 A      10/2014
(Continued)

OTHER PUBLICATIONS

Communication Pursuant to Article 94 (3) EPC in corresponding EP Application No. 20823571.3, mailed Dec. 11, 2024, 5 pages.
(Continued)

*Primary Examiner* — Michael Y Sun
(74) *Attorney, Agent, or Firm* — Rahman LLC

(57) ABSTRACT
A method for concentrated photovoltaic-thermal power generation includes converting a first portion of concentrated sunlight into electrical power when the first portion of concentrated sunlight illuminates an array of photovoltaic cells; and thermally coupling heat generated by the photo-
(Continued)

voltaic cells into a heat transfer plate. The method also includes cooling the heat transfer plate by flowing heat transfer fluid through an internal path of a cooling block in direct thermal contact with the heat transfer plate; and flowing the heat transfer fluid through a helical tube to absorb thermal energy from a second portion of concentrated sunlight illuminating the helical tube.

8 Claims, 19 Drawing Sheets

Related U.S. Application Data

(60) Provisional application No. 62/861,716, filed on Jun. 14, 2019.

(51) Int. Cl.

| | |
|---|---|
| *F24S 20/20* | (2018.01) |
| *F24S 70/65* | (2018.01) |
| F24S 23/72 | (2018.01) |
| F24S 30/452 | (2018.01) |
| H10F 10/10 | (2025.01) |
| H10F 10/16 | (2025.01) |
| H10F 19/90 | (2025.01) |
| H10F 77/124 | (2025.01) |

(52) U.S. Cl.
CPC .............. *F24S 23/72* (2018.05); *F24S 30/452* (2018.05); *H10F 10/10* (2025.01); *H10F 10/16* (2025.01); *H10F 19/906* (2025.01); *H10F 77/1248* (2025.01)

(58) Field of Classification Search
CPC ........ F24S 30/452; F24S 10/748; F24S 23/71; H10F 10/10; H10F 10/16; H10F 19/906; H10F 77/1248; H10F 19/00; H10F 19/80; H10F 77/488; H10F 77/60; Y02E 10/44; Y02E 10/47; Y02E 10/52; Y02P 80/20
See application file for complete search history.

(56) References Cited

U.S. PATENT DOCUMENTS

| | | | |
|---|---|---|---|
| 4,599,995 | A | 7/1986 | Dane |
| 6,080,927 | A | 6/2000 | Johnson |
| 9,219,183 | B2 | 12/2015 | Escher et al. |
| 2011/0263067 | A1 | 10/2011 | Vaid |
| 2012/0006383 | A1 | 1/2012 | Donnelly |
| 2012/0152309 | A1* | 6/2012 | Miller ................... F24S 30/455 136/246 |
| 2013/0255752 | A1 | 10/2013 | Escher et al. |
| 2016/0209079 | A1 | 7/2016 | Siddiqui et al. |

FOREIGN PATENT DOCUMENTS

| | | |
|---|---|---|
| GB | 2 525 853 A | 11/2015 |
| WO | 2015027333 A1 | 3/2015 |
| WO | WO 2018/157089 A1 | 8/2018 |

OTHER PUBLICATIONS

Extended European Search Report for European Patent Application No. 20823571.3 dated Jul. 14, 2023, 14 pages.

Ji, Y. et al., "A Sunflower Receiver for Hybrid Photovoltaic-Solar Thermal Energy Conversion", 2019 IEEE 46th Photovoltaic Specialists Conference (PVSC), 238-243 (Jun. 2019).

Royne et al., Design of a jet impingement cooling device for densely packed PV cells under high concentration, Elsevier Solar Energy 81, 2007, pp. 1014-1024.

Xue et al., Parametric analysis of a hybrid solar concentrating photovoltaic/concentrating solar power (CPV/CSP) system, Elsevier Applied Energy 189, 2017, pp. 520-533.

Otanicar et al., Envisioning advanced solar electricity generation: Parametric studies of CPV/T systems with spectral filtering and high temperature PV, Elsevier Applied Energy 140, 2015, pp. 224-233.

Vorobiev et al., Thermal-photovoltaic solar hybrid system for efficient solar energy conversion, Elsevier Solar Energy 80, 2006, pp. 170-176.

Neber et al. Design of a high temperature cavity receiver for residential scale concentrated solar power, Elsevier Energy 47, 2012, pp. 481-487.

Ju et al., A review of concentrated photovoltaic-thermal (CPVT) hybrid solar systems with waste heat recovery (WHR), Elsevier Science Bulletin 62, 2017, pp. 1388-1426.

Meng et al., A novel free-form Cassegrain concentrator for PV/T combining utilization, Elsevier Solar Energy 135, 2016, pp. 864-873.

Han et al., Energy analysis of a hybrid solar concentrating photovoltaic/concentrating solar power (CPV/CSP) system, Sci. Bull., Jan. 2015, pp. 460-469.

Kanatani et al., A model of a solar cavity receiver with coiled tubes, Elsevier Solar Energy 153, 2017, pp. 249-261.

Barrau et al., Outdoor test of a hybrid jet impingement/micro-channel cooling device for densely packed concentrated photovoltaic cells, Elsevier Solar Energy 107, 2014, pp. 113-121.

Soni et al, Overview of Different Solar Receiver on Basis of its Configuration and Heat Transfer Fluid, International Journal of Creative Research Thoughts vol. 5, Issue 3, Sep. 2017, pp. 522-528.

Jaaz et al., Outdoor Performance Analysis of a Photovoltaic Thermal (PVT) Collector with Jet Impingement and Compound Parabolic Concentrator (CPC), Materials 2017, 16 pages.

International Patent Application No. PCT/US2020/037663 International Search Report and Written Opinion dated Oct. 29, 2020, 8 pages.

Poonam Joshi "Effect of cooling condensing cover on the performance of N-identical photovoltaic thermal-compound parabolic concentrator active solar still: a comparative study" International Journal of Energy and Environmental Engineering (2018) 9:473-498 (Year: 2018).

Indian Patent Application No. 202227002234 Examination Report dated Nov. 7, 2025, 6 pages.

* cited by examiner

|  |  | Bare cell | Q1 | Q2 | Q3 | Q4 |
|---|---|---|---|---|---|---|
| $V_{oc}$ | V | 2.52 | 2.35 | 2.44 | 2.50 | 2.50 |
| $I_{sc}$ | A | 0.012 | 0.038 | 0.036 | 0.039 | 0.039 |
| $J_{sc}$ | mA/cm² | 13.1 | 11.9 | 11.1 | 12.0 | 12.0 |
| FF | % | 82.7 | 83.5 | 81.9 | 79.4 | 83.1 |
| η | % | 30.3 | 25.8 | 24.7 | 26.6 | 27.7 |

| CPV module distance from the dish focal plane | Electrical energy generated | Electrical energy fraction | Thermal energy captured | Thermal energy fraction | CPVT efficiency |
|---|---|---|---|---|---|
| mm | W | | W | | |
| 45.0 | 198.5 | 8.9% | 1491.2 | 67.2% | 76.1% |
| 50.0 | 169.0 | 7.6% | 1573.4 | 70.9% | 78.5% |
| 55.0 | 149.9 | 6.8% | 1627.9 | 73.3% | 80.1% |
| 60.0 | 127.7 | 5.8% | 1676.8 | 75.5% | 81.3% |
| 63.5 | 115.4 | 5.2% | 1703.5 | 76.7% | 81.9% |
| 65.0 | 108.4 | 4.9% | 1715.1 | 77.3% | 82.1% |
| 70.0 | 94.2 | 4.2% | 1744.9 | 78.6% | 82.8% |
| 75.0 | 81.9 | 3.7% | 1768.5 | 79.7% | 83.4% |
| 80.0 | 69.8 | 3.1% | 1793.3 | 80.8% | 83.9% |

*FIG. 21*

HYBRID RECEIVER FOR CONCENTRATED PHOTOVOLTAIC-THERMAL POWER SYSTEMS, AND ASSOCIATED METHODS

CROSS-REFERENCE TO RELATED APPLICATIONS

This application is a Divisional of U.S. application Ser. No. 17/619,185, filed Dec. 14, 2021, which is a 35 U.S.C. § 371 filing of International Application No. PCT/US2020/ 037663 filed Jun. 14, 2020, which claims priority to U.S. provisional patent application No. 62/861,716, titled "Concentrated Solar Photovoltaic and Photothermal Sunflower Receiver and System" and filed on Jun. 14, 2019, the entirety of which is incorporated herein by reference.

GOVERNMENT RIGHTS

The invention was made with U.S. Government support under grant number ARPA-E DE-AR0000473 from the U.S. Department of Energy. The United States government has certain rights in the invention.

BACKGROUND

Fossil fuels, including coal, oil, and natural gas, are currently the world's primary energy source. Formed from organic material over the course of millions of years, fossil fuels are finite resources categorized as non-renewable energy resources. According to the U.S. Energy Information Administration, the burning of fossil fuels was responsible for 76% of U.S. greenhouse-gas emission in 2017. These gases contribute to the greenhouse effect and could lead to potentially catastrophic changes in the Earth's climate. Problems with fossil fuels are related not only to global warming, but also to such environmental concerns as air pollutions, acid precipitation, and ozone depletion.

Renewable energy sources and technologies provide for sustainable energy development and avoid the impending shortage of fossil fuels. Renewable energy is derived from resources that are replenished naturally on a human timescale. Such resources include biomass, geothermal heat, sunlight, water, and wind. All of these sources are essential components of a nation's energy strategy because of concerns not only for the local and global greenhouse gas emissions, but also for energy security and sustainability. The potential for renewable sources is enormous as they, in theory, can produce many times the world's total energy demand. In the past thirty years, a variety of renewable energy technologies and energy efficiency measures has led to overall cost savings, making the displacement of fossil fuels possible with minimal increase in cost. Among these technologies, solar energy is a promising renewable energy resource that can be utilized in many places throughout the world.

SUMMARY

Solar energy can be converted into electrical energy through the photovoltaic (PV) effect. Semiconductor materials, such as monocrystalline silicon, polycrystalline silicon, microcrystalline silicon, copper indium selenide, cadmium telluride, gallium arsenide, and others, are used commercially to produce PV cells that are combined into PV panels and modules. One way to boost photoelectric energy production is to use optics that concentrate solar power onto a PV cell or module. These concentrator photovoltaic (CPV)

modules are cost-competitive when used with high-efficiency multijunction GaAs-based PV cells. Energy conversion efficiency, which quantifies the portion of sunlight energy that is converted into electrical energy, varies from 10.2% for amorphous silicon-based PV cells at a concentration of 1 sun to 46.9% for III-V multijunction PV cells at a concentration of 508 suns.

Solar energy can also be collected as thermal energy. Thermal receivers are devices that absorb solar radiation, converting it into heat and then transferring the heat to a fluid such as air, water, or oil. Solar receivers can be classified as non-concentrating or concentrating based on whether concentrating optics are used or not. A concentrating thermal receiver typically works with a parabolic mirror or Fresnel lens that focuses sunlight onto the thermal receiver, thereby achieving the high temperatures needed for industrial applications and electric power production.

To more efficiently use solar energy, hybrid concentrator photovoltaic-thermal (CPVT) power systems have been developed that combine CPV modules with thermal receivers to generate electrical energy and thermal energy simultaneously. Industrial process heat accounts for more than two-thirds of the world's total industrial energy consumption, which is a large market for solar energy that is almost entirely untapped. Most of the demand is for temperatures below 250° C. CPVT power systems can reach these temperatures due to the separate configurability of CPV modules and thermal receivers. Applications include food, wine and beverages, textiles, machinery, solar heating, desalination, enhanced oil recovery, and wood pulp and paper processing.

Although III-V multi-junction PV cells have demonstrated improved performance compared to single-junction PV cells, more than half of the absorbed solar energy is converted to thermal energy, causing the junction temperature to rise. Since the efficiency of a PV cell typically decreases as its temperature increases, cooling systems are frequently used to keep PV cell efficiency optimized. Many active cooling systems for CPV modules pump a heat transfer fluid or gas across a thermally conductive backplane upon which the PV cells are mounted. The waste heat is captured by the fluid (e.g., via thermal conduction from the backplane into the fluid) and carried away from the PV cells. This waste heat may be dumped, which reduces system efficiency. Alternatively, the waste heat can be utilized for low-temperature (e.g., less than 80° C.) process-heat applications.

The present embodiments feature a hybrid receiver for CPVT power systems that combines a CPV module with a thermal module that acts as both a thermal receiver and cooling system for PV cells in the CPV module. The hybrid receiver uses the same fluid for both PV-cell cooling and thermal power generation, advantageously increasing efficiency by contributing the waste heat from the PV cells to the generated thermal power. Therefore, instead of dumping the waste heat from the PV cells, or outputting the waste heat via a low-temperature thermal output, the present embodiments feature only one high-temperature thermal output at a temperature that is higher than what the thermal receiver could generate on its own.

The hybrid receiver may be placed between a concentrator mirror and its focal plane, where rays of concentrated sunlight from the concentrator mirror are not parallel. Some of the concentrated sunlight directly illuminates the CPV module, where it is converted to electrical power. Some of the concentrated sunlight also direct illuminates the top and sides of the thermal module, where it is absorbed as thermal energy. In some embodiments, the hybrid receiver also includes a reflective shroud that surrounds the hybrid receiver, and reflects scattered light from the hybrid receiver back onto to the thermal module, where it can be absorbed. The shroud also reduces convective energy loss of the thermal module by blocking wind currents. Heat transfer fluid flowing underneath the CPV module carries away waste heat from the PV cells. The heat transfer fluid then flows through a helical tube to absorb heat from both direct sunlight and scattered light reflected onto the helical tube by the shroud. The heat transfer fluid is continuously heated as it flows through the helical tube. The heat transfer fluid then exits the helical tube, where it can be used for high-temperature process-heat applications. The heat transfer fluid can be water, oil, or another fluid used for cooling and process heat.

With the present embodiments, the ratio of electrical power to thermal power can be easily changed by moving the hybrid receiver closer to, or away from, the focal plane of the concentrator mirror. This movement changes what fraction of concentrated sunlight reaches the CPV module versus the helical tube. With water as the heat transfer fluid, the present embodiments can maintain PV-cell temperatures below 110° C. with output temperatures of the heat transfer fluid above 200° C.

4

Figures 18, 19:
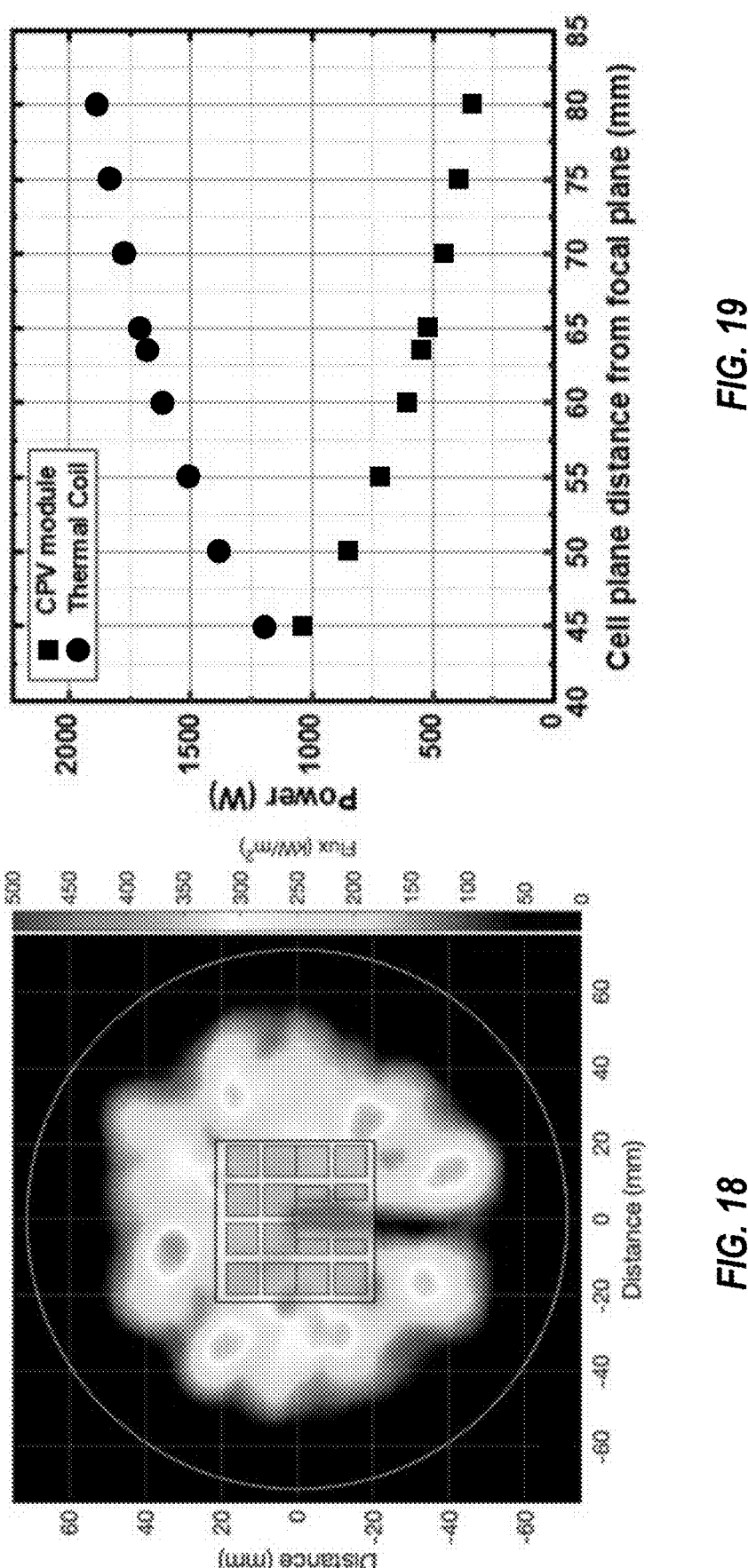
FIG. 18 shows an exemplary flux map measured for a dish and tracker that may be used to test a prototype of the hybrid receiver of FIG. 5.

FIG. 19 shows an exemplary plot of solar power incident on the CPV module and the helical tube as a function of cell-plane distance inboard from the focal plane of the dish.

Figure 20:
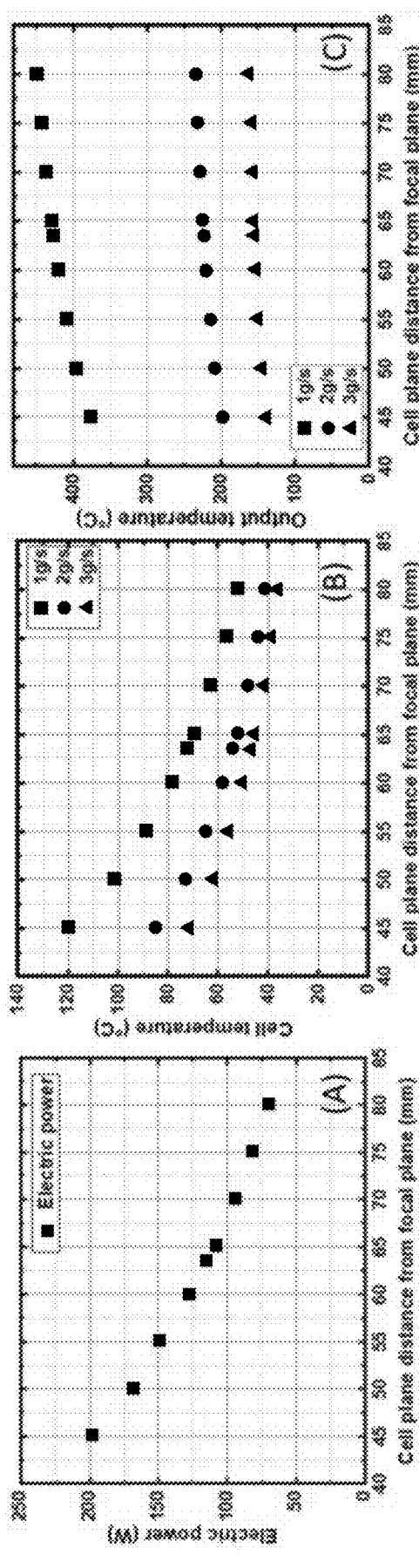

FIG. 20 shows exemplary plots of predicted performance of the prototype hybrid receiver.

FIG. 21 is a table listing predicted electrical and thermal energies generated by the prototype hybrid receiver when operating at different distances between the CPV module and a focal plane of the dish.

DETAILED DESCRIPTION OF THE EMBODIMENTS

Figure 1:
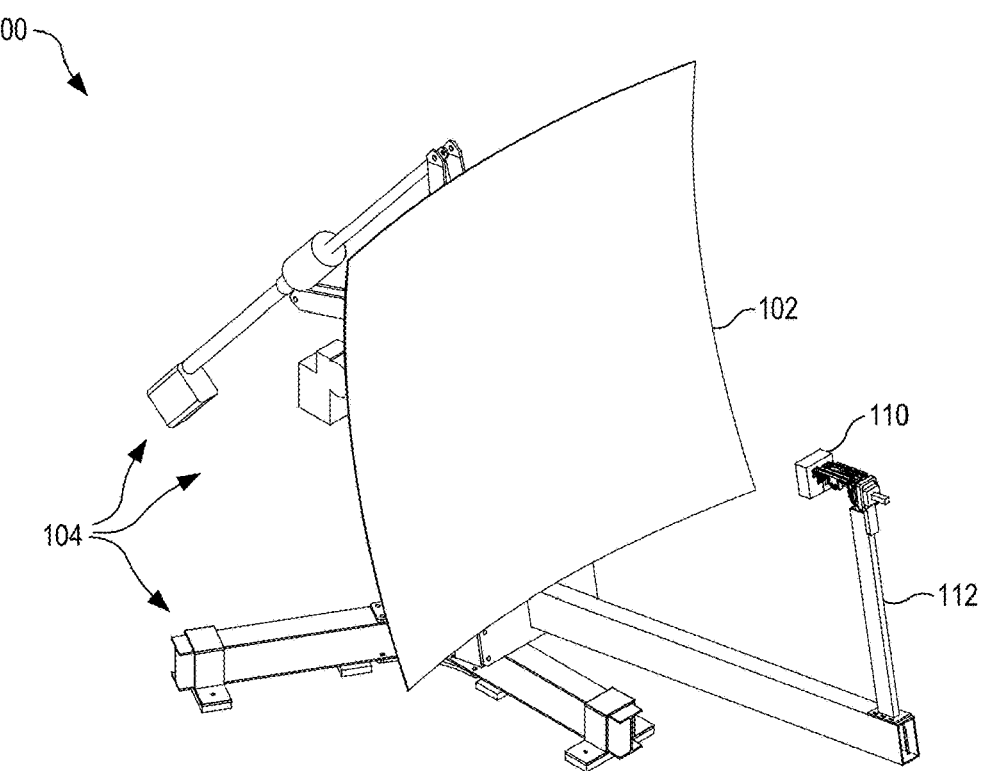
FIGS. 1 and 2 are a perspective view and side view, respectively, of a concentrator photovoltaic-thermal (CPVT) power system with a hybrid receiver, in an embodiment.
Figure 2:
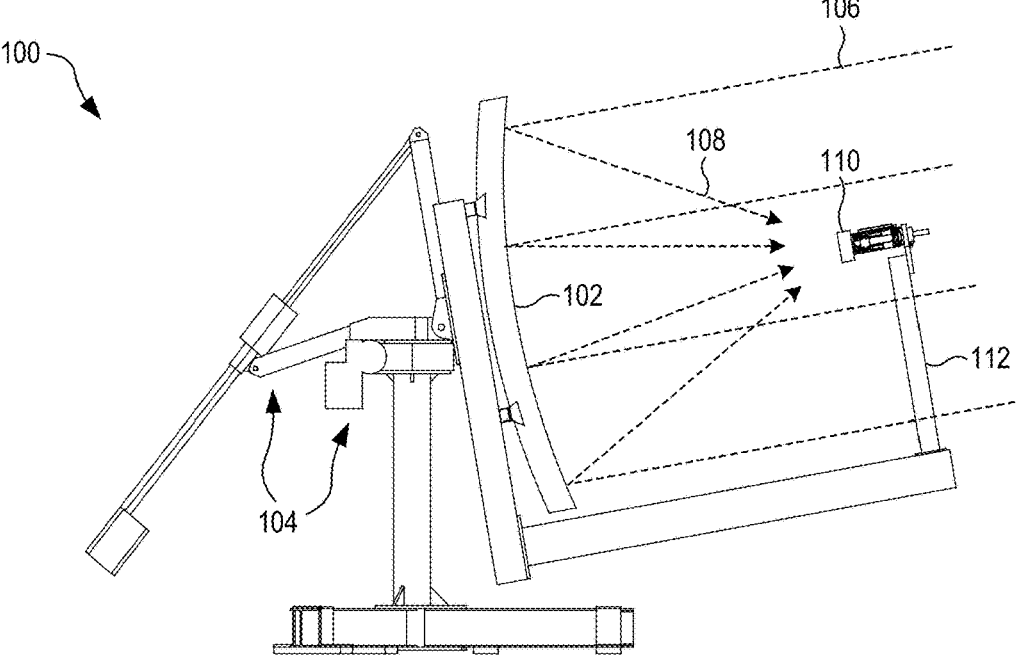

FIGS. 1 and 2 are a perspective view and side view, respectively, of a concentrator photovoltaic-thermal (CPVT) power system 100 that uses a hybrid receiver 110 to convert sunlight 106 into electrical power and thermal power. The CPVT power system 100 includes a concentrator dish 102 that reflects and concentrates sunlight 106 onto the hybrid receiver 110 as concentrated light 108. Some of the concentrated light 108 is converted into electrical energy by a concentrator photovoltaic (CPV) module of the hybrid receiver 110 (e.g., see CPV module 504 in FIG. 5). Some of the concentrated light 108 is converted into thermal heat by a thermal module of the hybrid receiver 110 (see thermal module 502 in FIG. 5). The hybrid receiver 110 is located in front of the focal plane of the dish 102 (i.e., between the dish 102 and the focal plane), and oriented to directly face the dish 102. The hybrid receiver 110 may be used at low concentrations (i.e., less than 100 suns), medium concentrations (i.e., up to 300 suns), or high concentrations (i.e., up to 1000 suns, or more).

The CPVT power system 100 also includes a two-axis solar tracker 104 that changes an elevation angle, an azimuthal angle, or both, of the concentrator dish 102 as the sun moves across the sky. The hybrid receiver 110 is affixed to a support arm 112 which, in turn, is affixed to the solar tracker 104. Therefore, as the dish 102 moves, the hybrid receiver 110 is always located at the same distance from of the dish 102 and oriented facing the dish 102. Tracking of the sun with the two-axis solar tracker 104 maximizes the amount of the sunlight 106 that the dish 102 focuses onto the hybrid receiver 110, thereby maximizing the electrical power and thermal power generated by the hybrid receiver 110. While the dish 102 is shown in FIGS. 1 and 2 as a parabolic dish, the concentrator 102 may be another type of concentrator mirror or dish without departing from the scope hereof.

Figure 3:
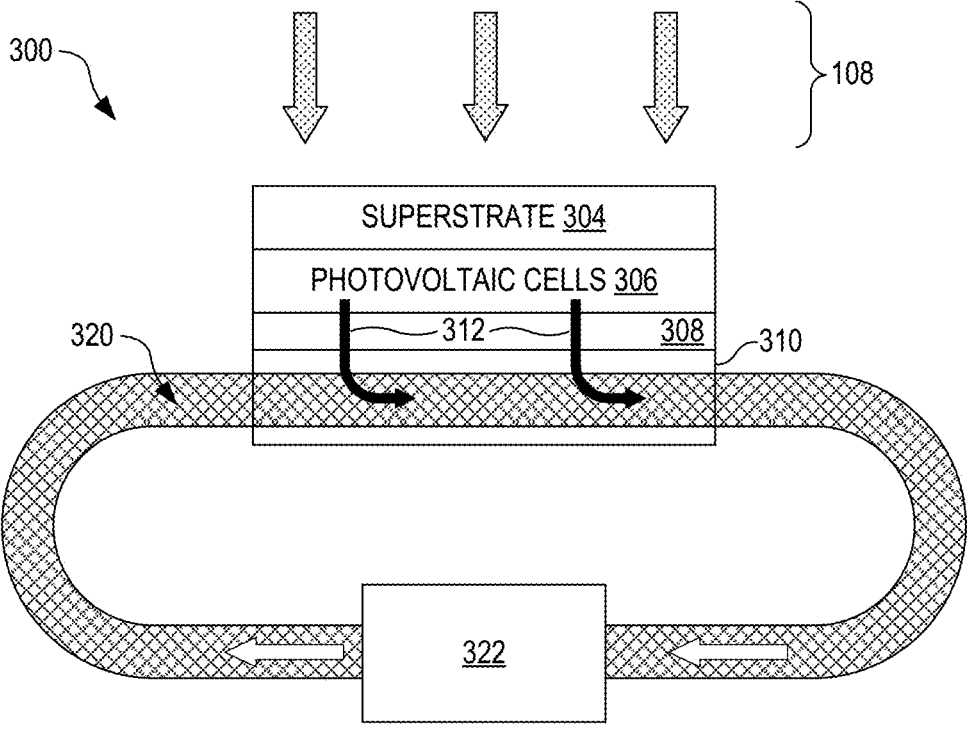
FIG. 3 illustrates fluid cooling of photovoltaic (PV) cells in an optoelectronic stack.

FIG. 3 illustrates fluid cooling of photovoltaic (PV) cells 306 in an optoelectronic stack 300. The optoelectronic stack 300 may be used as the CPV module of the hybrid receiver 110 of FIGS. 1 and 2. Concentrated light 108 passes through a transparent superstrate 304 to illuminate the PV cells 306, which convert some of the concentrated light 108 into electrical power. Waste heat 312 from the PV cells 306 is conducted through a heat transfer plate 308 and into a cooling block 310 through which heat transfer fluid 320 flows. A heat exchanger 322 removes the heat 312 from the heat transfer fluid 320, and pumps the heat transfer fluid 320 so that it flows with a sufficient speed to cool the cooling block 310, and therefore the heat transfer plate 308 and photovoltaic cells 306.

Figure 4:
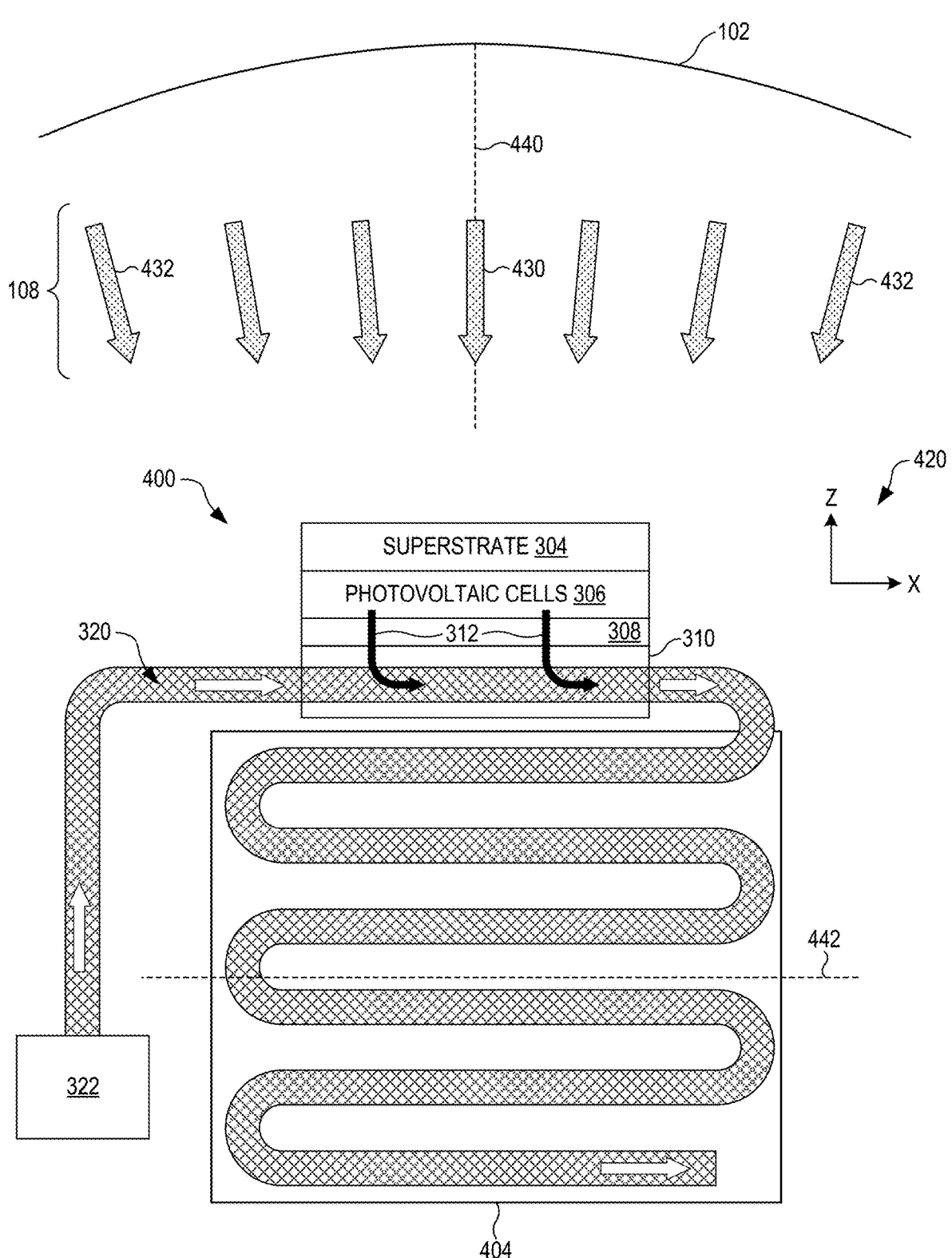
FIG. 4 illustrates how the present embodiments implement fluid cooling of an optoelectronic stack, in embodiments.

FIG. 4 illustrates how the present embodiments implement fluid cooling of an optoelectronic stack 400, in embodiments. Like the optoelectronic stack 300 of FIG. 3, the optoelectronic stack 400 contains PV cells 306 that generate waste heat 312. In FIG. 4, heat transfer fluid 320, after absorbing waste heat 312, flows along a helical path 404 located behind the optoelectronic stack in the z direction (see right-handed coordinate system 420). The optoelectronic stack 400 faces the dish 102 in the +z direction to receive some concentrated light 108. In the x-y plane, the optoelectronic stack 400 is centered on an optical axis 440 of the dish 102. In the z direction, the optoelectronic stack 300 is located "inboard" of a focal plane 442 of the dish 102, i.e., between the dish 102 and the focal plane 442.

Centered light 430 of the concentrated light 108 propagates along or near the optical axis 440. More specifically, and as shown in FIG. 4, rays of centered light 430 are nearly parallel to the optical axis 440 (i.e., angles between the rays of centered light 430 and the optical axis 440 are near zero). By contrast, off-centered light 432 propagates farther from the optical axis 440. More specifically, and also shown in FIG. 4, rays of off-centered light 432 are displaced in the x-y plane farther from the optical axis 440 than centered light 430, and form larger angles with respect to the optical axis 440 than centered light 430. Due to these larger displacements and angles, off-centered light 432 misses the optoelectronic stack 400 and instead illuminates sides of the helical path 404, where the heat transfer fluid 320 absorbs the thermal energy of the off-centered light 432. Note that off-centered light 432 converges since the optoelectronic stack 300 is located "inboard" of a focal plane 442. If the optoelectronic stack 300 were located on the other side of the focal plane 442, off-centered light 432 would diverge, thereby missing the sides of the helical path 404.

Advantageously, the fluid cooling shown in FIG. 4 increases the thermal energy generated by the thermal module by utilizing the waste heat 312 from the CPV module. The heat transfer fluid 320 can therefore achieve a higher temperature, when it exits the thermal module, than the maximum solar cell temperature.

Figure 5:
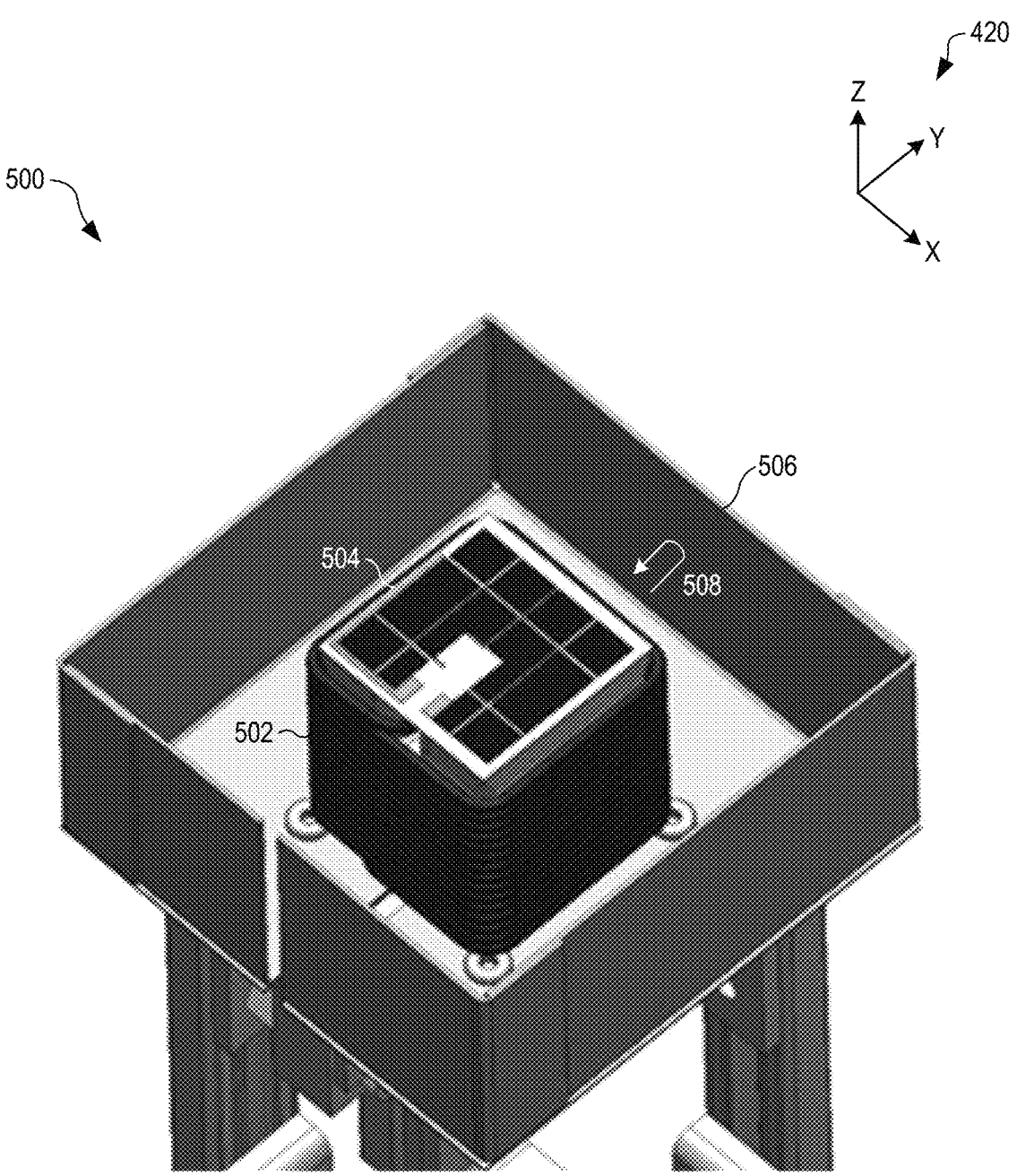
FIG. 5 is a perspective view of a hybrid receiver that advantageously uses only one heat-transfer-fluid system to both cool PV cells and absorb thermal heat from sunlight, in an embodiment.

FIG. 5 is a perspective view of a hybrid receiver 500 that advantageously uses only one heat-transfer-fluid system to both cool PV cells and absorb thermal heat from sunlight. The hybrid receiver 500 is one example of the hybrid receiver 110 of FIGS. 1 and 2. The hybrid receiver 500 includes a CPV module 504 that uses PV cells 306 to convert concentrated light 108 into electrical power. The hybrid receiver 500 also includes a thermal module 502 beneath the CPV module 504 that absorbs additional concentrated light 108 to generate thermal power. To enhance thermal power generation in some embodiments, the hybrid receiver 500 may include a reflective shroud 506 surrounding the thermal module 502 and CPV module 504. The shroud 506 acts as a secondary reflector that redirects indirect light 508 from the CPV module 504 and thermal module 502 back toward the thermal module 502 so that it can be absorbed. Indirect light 508 may include: (a) concentrated light 108 that scatters off of the CPV module 504 and thermal module 502 (e.g., via reflection or diffraction), and (b) thermal radiation emitted by the CPV module 504 and thermal module 502. Although not shown in FIG. 5, indirect light 508 propagates away from the CPV module 504 and thermal module 502 in all directions. In embodiments, and as shown in FIG. 5, the shroud 506 encircles the thermal module 502 without gaps to maximize the amount of indirect light 508 redirected back to the thermal module 502. The shroud 506 also minimizes convective energy loss of the thermal module 502 by blocking wind currents.

Figure 6:
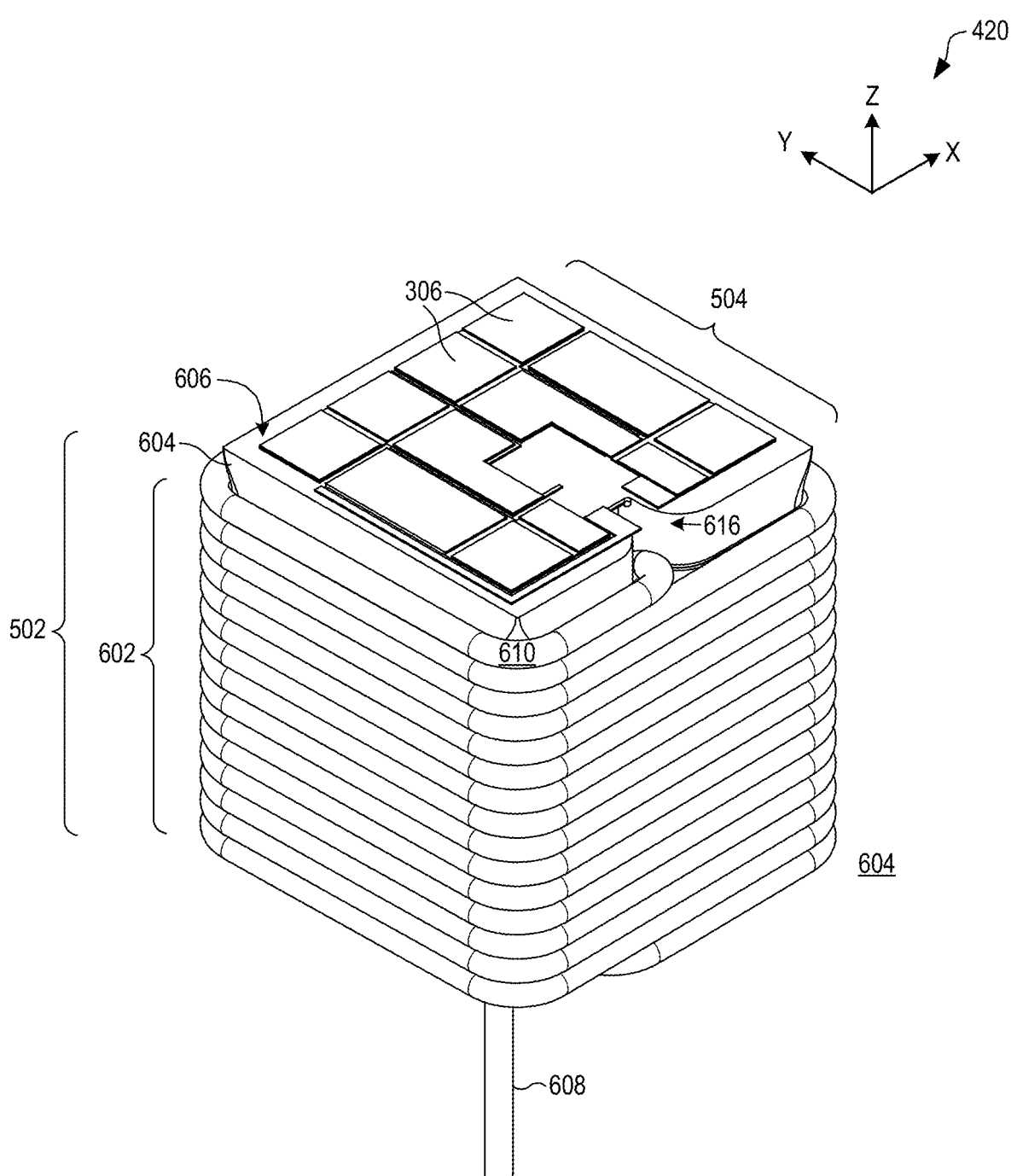
FIGS. 6, 7, and 8 are a perspective view, side view, and bottom view, respectively, of CPV and thermal modules of the hybrid receiver of FIG. 5, in an embodiment.
Figure 7:
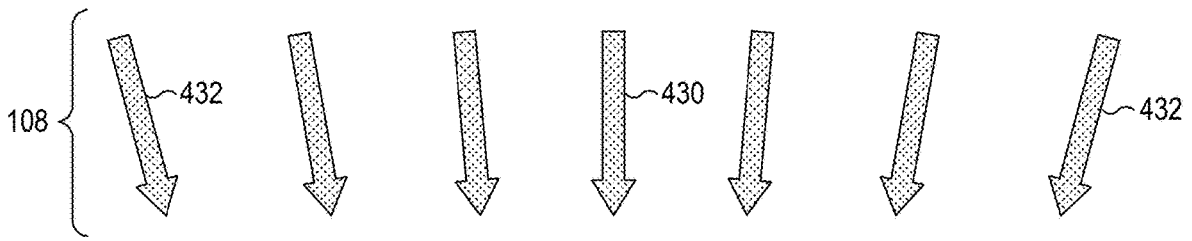
Figure 7:
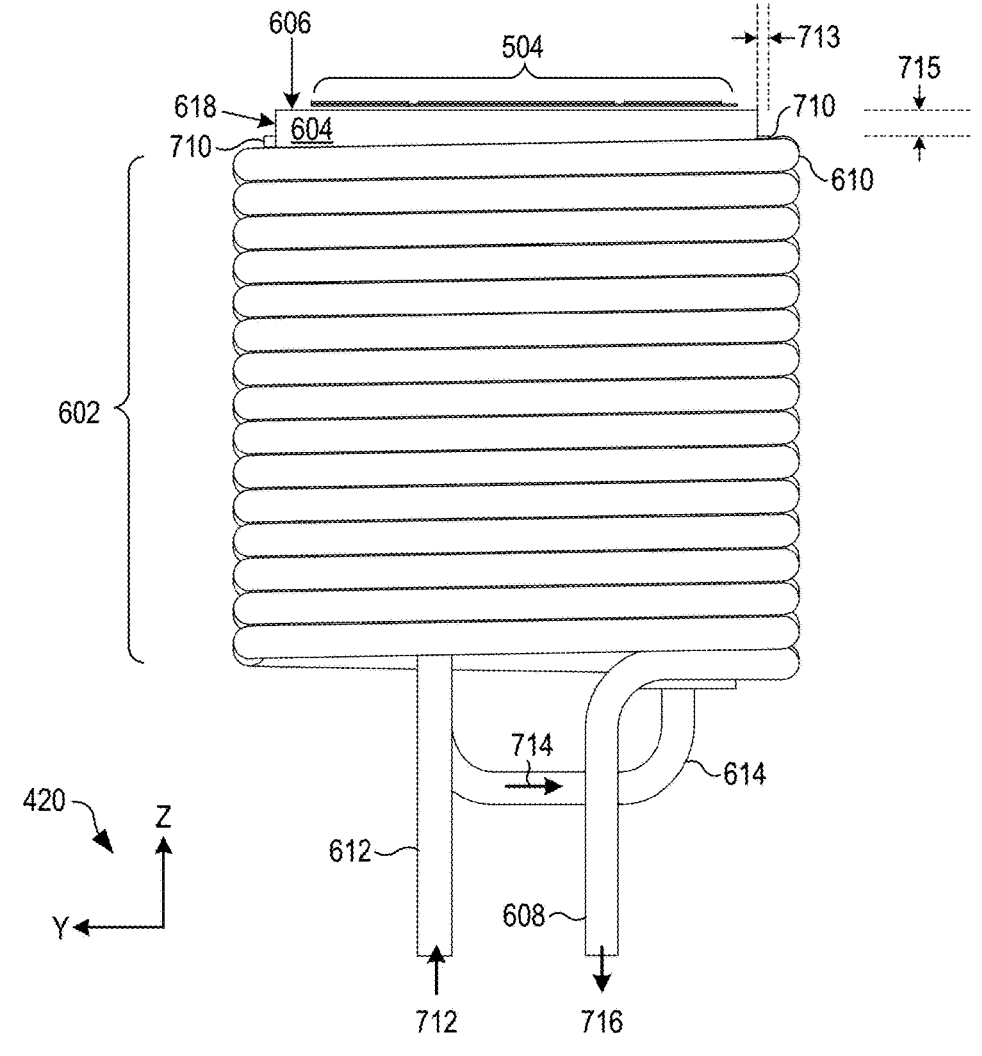
Figure 8:
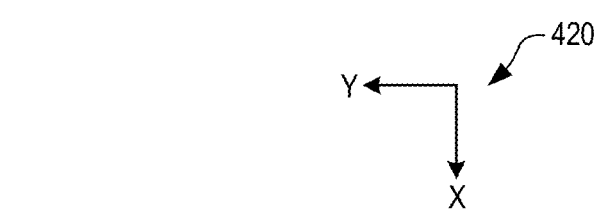
Figure 8:
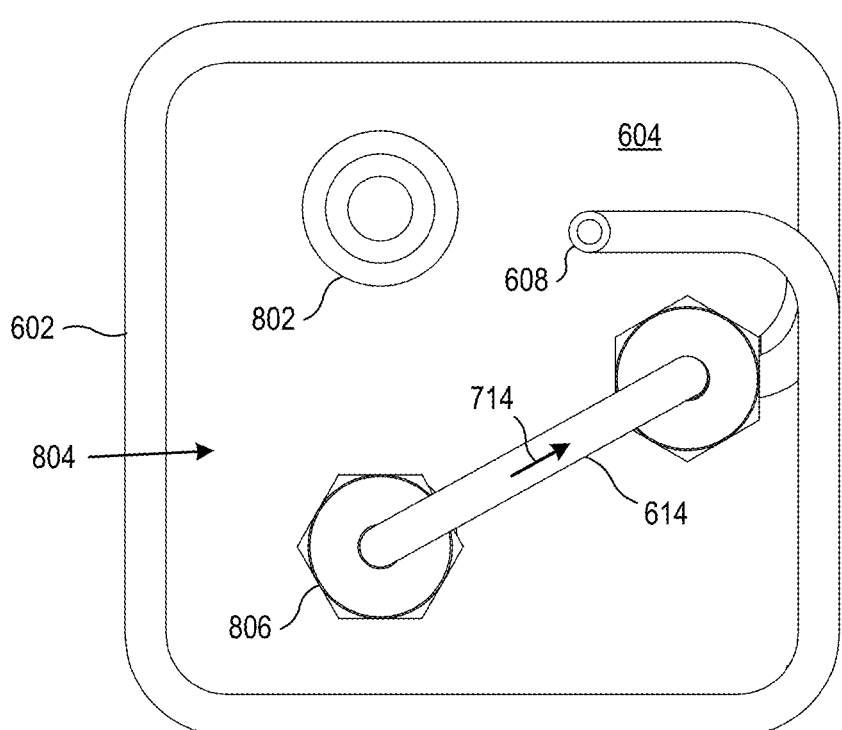

FIGS. 6, 7, and 8 are a perspective view, side view, and bottom view, respectively, of the CPV module 504 and thermal module 502. FIG. 7 also illustrates how the CPV module 504 receives centered light 430 and how the thermal module 502 receives non-centered light 432. FIGS. 6, 7, and 8 are best viewed together in the following description.

The thermal module 502 includes a helical tube 602 and a cooling block 604. The CPV module 504 includes an array of PV cells 306 mounted on a heat transfer plate (see heat transfer plate 920 in FIG. 9) that is in direct thermal contact with a top face 606 of the cooling block 604. As shown in FIGS. 5-8, the cooling block 604 may be shaped such that the entire bottom face of the CPV module 504 (see bottom face 922 in FIG. 9) is in direct thermal contact with the top face 606 of the cooling block 604. However, the cooling block 604 may be alternatively shaped such that only a part of the bottom face of the CPV module 504 is in direct thermal contact with the top face 606.

Cold heat transfer fluid 712 flows through an input tube 612 in the +z direction to enter the cooling block 604 via an inlet 802 located on a bottom face 804 of the cooling block 604. For clarity, the input tube 612 is only shown in FIG. 7. Inside the cooling block 604, the heat transfer fluid travels along a serpentine path to absorb heat from the PV cells 306 through the top face 606 (see serpentine path 1210 in FIG. 12B). After absorbing waste heat 312 from the PV cells 306, warm heat transfer fluid 714 exits the cooling block 604 via an outlet 806 and enters the helical tube 602 via a rigid transfer tube 614. After directly absorbing non-centered light 432 illuminating the helical tube 602, hot heat transfer fluid 716 leaves the helical tube 602 via an output tube 608. In embodiments, the input tube 612 is a rigid tube that mechanically supports all of the CPV module 504 and thermal module 502.

FIGS. 5-8 show the helical tube 602 as a square helix with approximately fifteen turns. However, the helical tube 602 may be alternatively configured as a rectangular helix, a circular helix, or another type of helix. The helical tube 602 may also have a different number of turns than shown without departing from the scope hereof. In FIGS. 5-8, the helical tube 602 is shown as tightly packed, i.e., each turn directly contacts the one turn directly above it (when present), and the one turn directly below it (when present). Tight packing advantageously increases the surface area with which non-centered light 432 and indirect light 508 are captured by eliminating gaps between the turns. To enhance the structural rigidity of the helical tube 602, adjacent turns may be brazed or welded together, thereby filling gaps between the turns that may otherwise exist. However, the helical tube 602 may be alternatively shaped with gaps between neighboring turns, again without departing from the scope hereof.

To enhance direct absorption of concentrated light 108, the helical tube 602 may be coated with a black finish. For example, the helical tube 602 may be coated with a highly absorptive high-temperature black solar paint, such as Pyromark 2500, or a nanomaterial-based black coating. Alternatively, the outside surfaces of the helical tube 602 may be surface-treated to be black (e.g., anodization) or otherwise absorptive.

The helical tube 602 may be formed from a single metal tube bent into a helical shape. For example, the metal may be aluminum, copper, or brass, which have high thermal conductivities, are commercially available as tubes, and can welded or brazed using known techniques. However, the helical tube 602 may be formed from a different type of metal (e.g., stainless steel) without departing from the scope hereof. As shown in FIGS. 7 and 8, the output tube 608 may be a portion of the helical tube 602 bent in the −z direction.

In an embodiment, and as shown in FIG. 7, a topmost turn 610 of the helical tube 602 is positioned below the top face 606 by an offset 715. Subsequent turns of the helical tube 602 continue in the −z direction. The offset 715 may be selected to prevent non-centered light 432 from directly illuminating side walls 618 of the cooling block 604, which would inadvertently heat the cooling block 604. For example, the offset 715 may be equal to, or less than, a diameter of the helical tube 602. Alternatively, the offset 715 may be slightly negative, i.e., the topmost turn 610 may be positioned slightly above the top face 606 provided that it does not block concentrated light 108 from reaching the PV cells 308. Alternatively, the offset 715 may be larger than shown in FIG. 7 to minimize thermal conduction of heat from the helical tube 602 into the cooling block 604, which would inadvertently heat the CPV module 504.

In FIGS. 5-8, each turn of the helical tube 602 encloses an area (in the x-y plane) slightly larger than that of the cooling block 604 such that the topmost turn 610 can block the side walls 618 of the cooling block 604 from concentrated light 108. In this arrangement, the helical tube 602 is positioned such that a gap 713 between the topmost turn 610 and the side walls 618 is small (e.g., less than a diameter of the helical tube 602). One or more thermal insulation pieces 710 with low thermal conductivity may be inserted between the cooling block 604 and helical tube 602 to prevent the cooling block 604 and helical tube 602 from contacting each other, which would result in a thermal short. The helical tube 602 may be shaped to enclose a larger area so that the gap 713 is larger than shown. A larger gap 713 may also help reduce thermal conduction of heat from the topmost turn 610 into the cooling block 604. However, a larger gap 713 may also result in more concentrated light 108 illuminating the side walls 618. Furthermore, a larger gap 713 increases the thickness of the thermal insulation pieces 710 and therefore the amount of concentrated light 108 directly absorbed by these thermal insulation pieces 710. This absorbed light is wasted since the resulting heat cannot be efficiency coupled to the heat transfer fluid.

Figure 9:
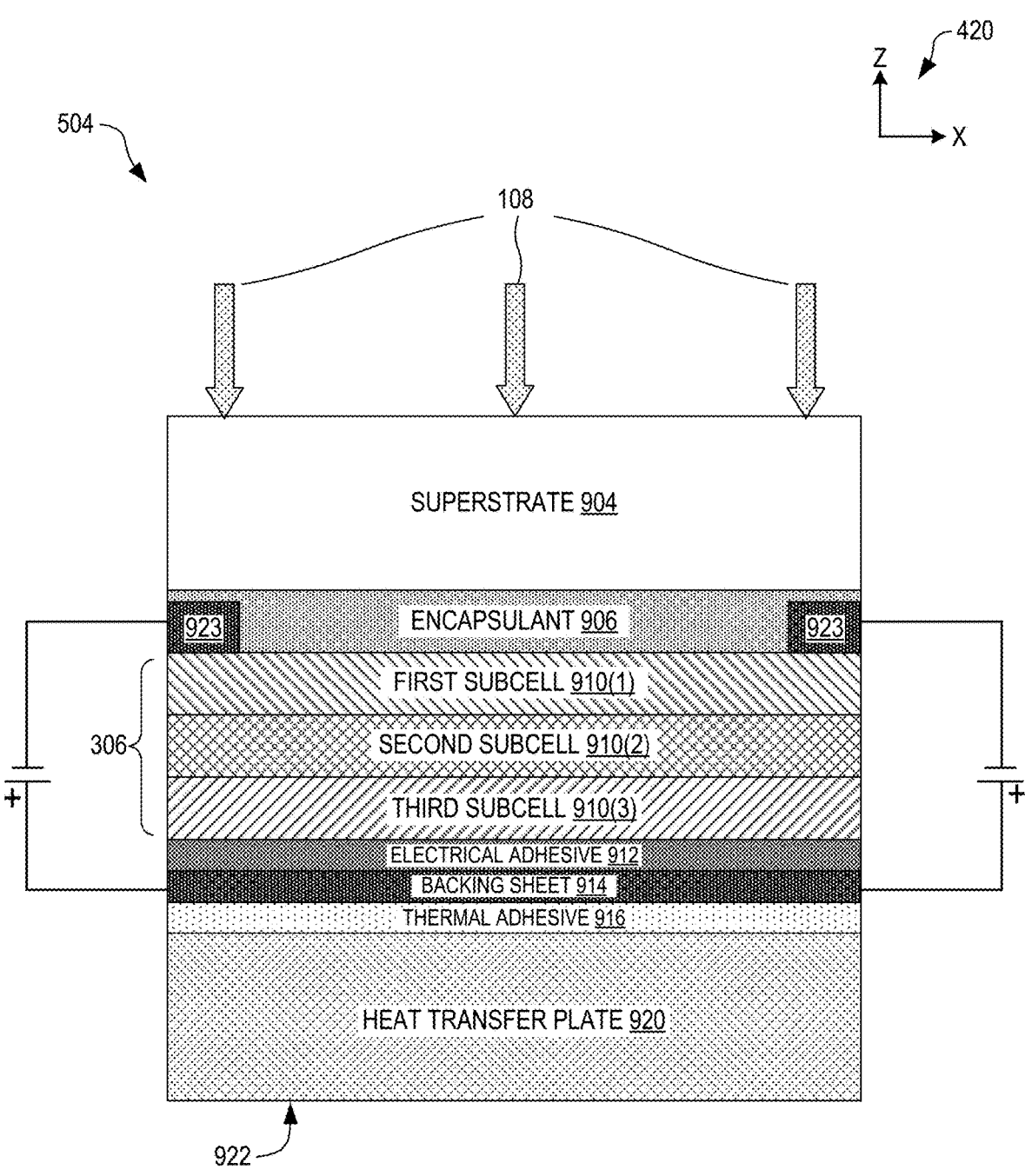
FIG. 9 is a side cut-away view of the CPV module of FIG. 5 in regions where a PV cell is present, in an embodiment.

FIG. 9 is a side cut-away view of the CPV module 504 in regions where a PV cell 306 is present. The layers in FIG. 9 are not drawn to scale. Concentrated light 108 propagating in the −z direction is transmitted through a superstrate 904 and an encapsulant 906 to reach the PV cell 306. The superstrate 904 and encapsulant 906 protect the CPV module 504 from external environmental conditions such as moisture and debris. In embodiments, the superstrate 904 and encapsulant 906 are optically transparent, thermally shock resistant, mechanically rigid, and stable at the operating temperature of the CPV module 504.

In the example of FIG. 9, the PV cell 306 is a three-junction cell with a first subcell 910(1), a second subcell 910(2), and a third subcell 910(3). The PV cell 306 is electrically connected to an electrically conductive backing sheet 914 using electrical adhesive 912 or solder. The backing sheet 914 is rigidly affixed to heat transfer plate 920 with thermal adhesive 916. A bottom face 922 of the heat transfer plate 920 directly contacts the top face 606 of the cooling block 604. Bus bars 923 on top of the first subcell 910(1) act as a cathode, while the backing sheet 914 acts as an anode. While the example of FIG. 9 through a three-junction PV cell 306, the CPV module 504 may be configured with PV cells 306 have a different number of layers. For example, each PV 306 may have only one or two subcells 910, or four or more subcells 910. Each PV cell 306 may have an anti-reflection coating on top of the first subcell 910(1) (not shown in FIG. 9).

The superstrate 904 may be made of crystalline quartz, fused silica, sapphire, glass, or another type of rigid optically transparent material. The superstrate 904 may also have an anti-reflection coating on one or both of its faces. The encapsulant 906 may be a silicone elastomer using polydimethylsiloxane (PDMS), such as Dow Corning Sylgard 184. The electrically conductive backing sheet 914 may be sheet or foil made of silver or another type of metal with high electrical conductivity. The heat transfer plate 920 may be made of alumina, which is an electrical insulator with a relatively high thermal conductivity. The heat transfer plate 920 may be alternatively made from another type of ceramic, a different class of materials, or a combination of electrically insulating with having high thermal conductivity. In some embodiments, the backing sheet 914 is metal directly deposited (e.g., via electroplating) onto the heat transfer plate 920. These embodiments advantageously avoid the need for thermal adhesive 916.

Figure 10:
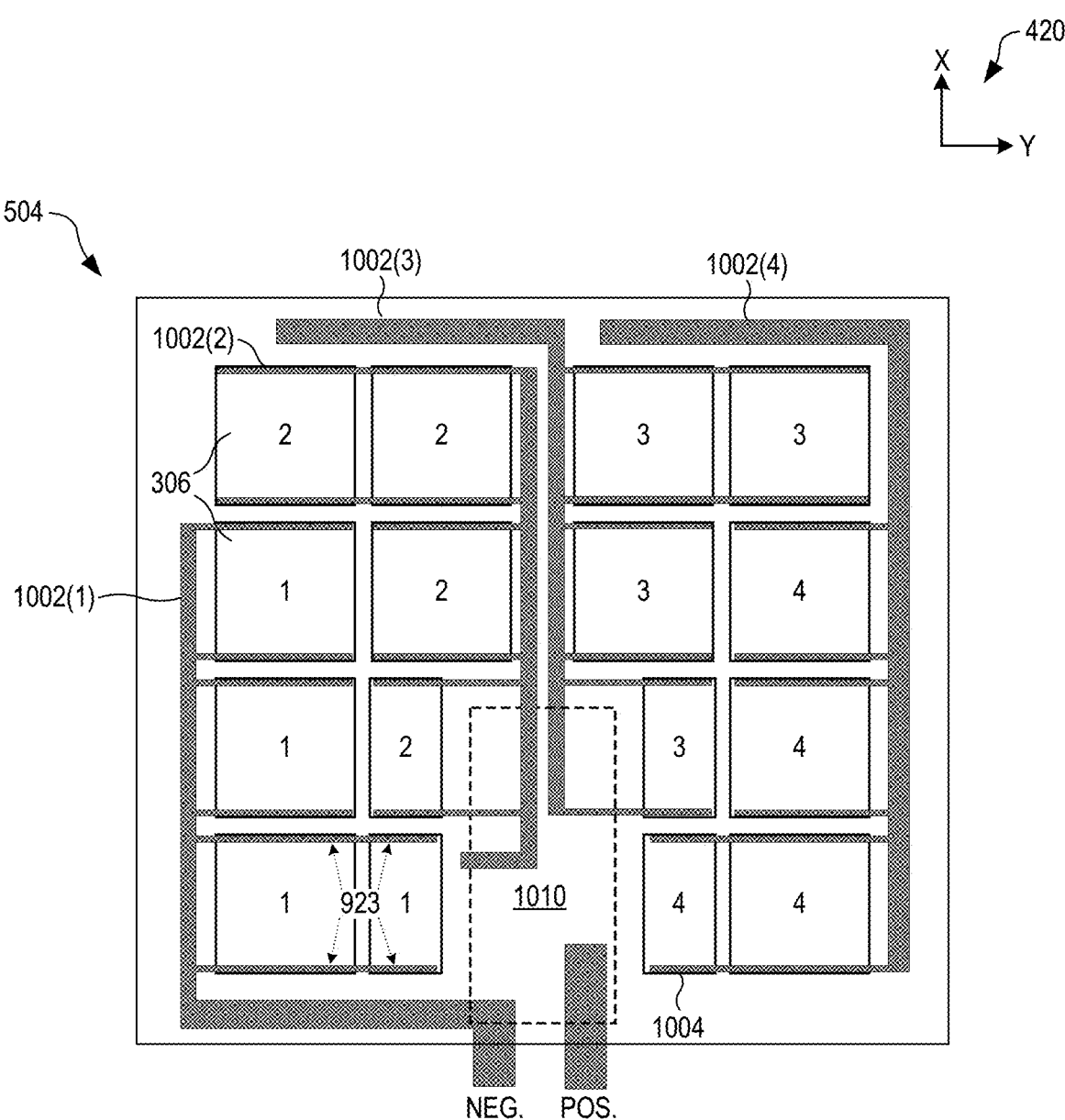
FIG. 10 is a top view of the CPV module of FIG. 5 showing the layout of PV cells, in an embodiment.

FIG. 10 is a top view of the CPV module 504 showing the layout of the PV cells 306. In this example, there are sixteen PV cells 306 arranged in a two-dimensional array of four rows and four columns. The PV cells 306 are grouped in four sets (also referred to as "quadrants") and each of the PV cells 306 in FIG. 10 is labeled with the number of the set to which it belongs. Each set also includes one half-sized PV cell 1004 whose active area is approximately one-half of that of the other "full-sized" PV cells 306. The four half-size PV cells 1004 are sized and positioned to create a shadow region 1010 within which the solar flux is minimal due to blockage by the support arm 112 (see FIGS. 1 and 2).

All of the PV cells 306 within each set are electrically connected in parallel, and the sets are connected in series. More specifically, a first wire 1002(1) connects to bus bars 923 on the front faces of the four PV cells 306 in the set "1", a second wire 1002(2) connects to the bus bars 923 on the front faces of the four PV cells 306 in the set "2", and so on. Thus, the wires 1002 connect cathodes of the PV cells 306. Similar wires connecting the anodes of the PV cells 306 are not shown in FIG. 10. The anodes of the fourth set of PV cells 306 are connected to a first electrical terminal (labeled "POS" in FIG. 10), and the first wire 1002(1) connects the cathodes of the first set of PV cells 306 to a second electrical terminal (labeled "NEG" in FIG. 10). The wires 1002 may be made of silver or another metal with high electrical conductivity.

The PV cells 306 may have a different arrangement than shown in FIG. 10 without departing from the scope hereof. For example, the PV cells 306 may form a two-dimensional array with more than four rows or less than four rows, more than four columns or less than four columns, or a combination thereof. In FIG. 10, most of the PV cells 306 are spaced from their nearest neighbors by a gap of 1 mm. However, the PV cells 306 may be spaced such that the gap has different value. The PV cells 306 may also be wired in a different configuration, and therefore may be grouped into more than four sets or less than four sets. The number and positions of the half-sized PV cells 1004 may also be changed to vary the size and location of the shadow region 1010 (e.g., to overlap the shadow caused by the support arm 112).

Design Methodology

CPV Module—To build a prototype of the hybrid receiver 110, a prototype of the CPV module 504 was constructed using the geometry shown in FIGS. 5-10. The superstrate 904 was made from GE 124 fused quartz, and the encapsulant 906 was Dow Corning Sylgard 184 silicone. The anodes of the PV cells 306 were adhered to a silver backing sheet 914 using SnPd electrical solder as the electrical adhesive 912. Thermal adhesive 916 (Cotronic Duralco 128)

was applied between the silver backing sheet 914 and the heat transfer plate 920 to increase thermal conductivity therebetween. The heat transfer plate 920 was made of alumina because it is an electrical insulator with a high thermal conductivity of 25 W/m·K at room temperature. This choice of material allows waste heat 312 from the PV cells 306 to be efficiently conducted to the cooling block 604 without electrical shorts.

Figure 11:
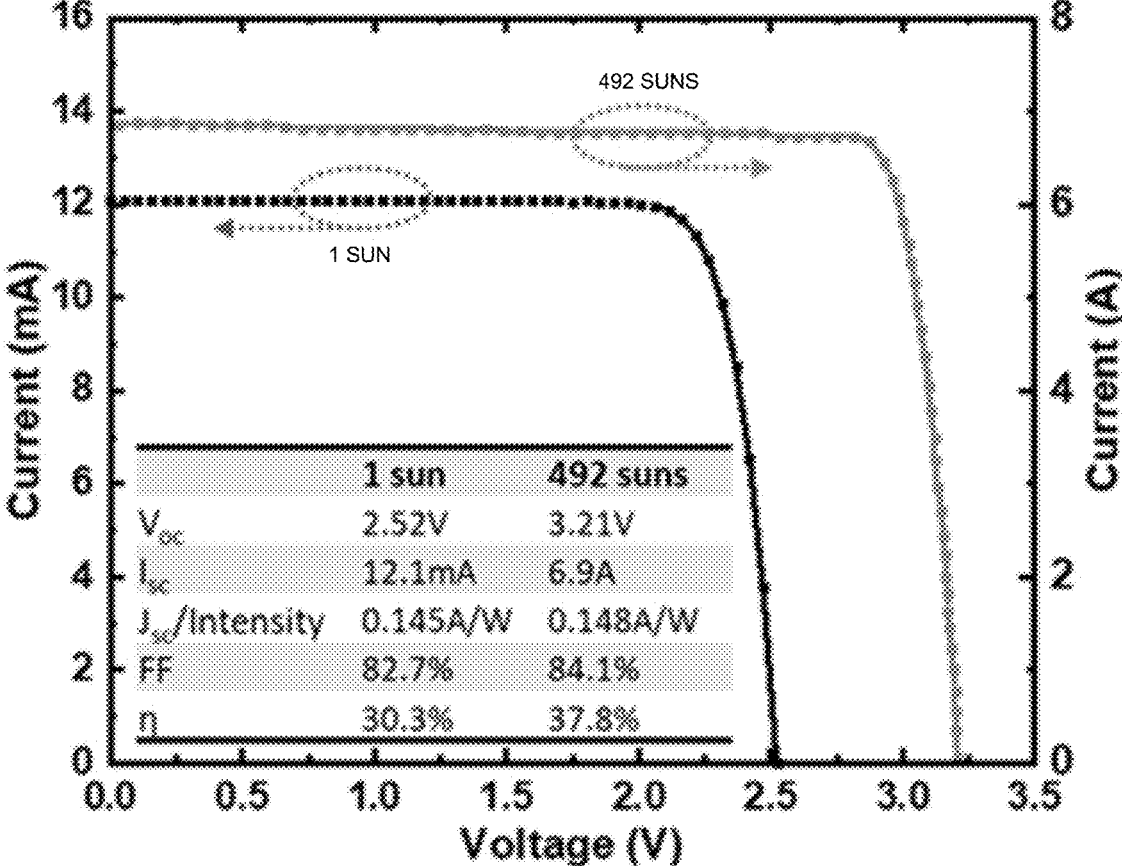
FIG. 11 shows exemplary current-voltage curves measured with a triple-junction PV cell.

FIG. 11 shows exemplary current-voltage curves measured with a triple-junction PV cell 306 used with the prototype CPV module 504. The data in FIG. 11 was measured for concentrations of 1 sun and 492 suns at a temperature of 25° C. The triple-junction PV cells 306 were fabricated with n-on-p structure by SolAero Technologies, and built on germanium substrates. The photovoltaic absorber materials of the triple-junction PV cells 306 are InGaP (1.86 cV), InGaAs (1.40 cV), and Ge (0.67 cV). An anti-reflection coating was deposited on the PV cells 306 to lower reflectance between 0.3 μm and 1.8 μm. The $V_{oc}$ is 2.52 V for 1 sun and 3.21 V for 492 suns, while the $I_{sc}$ increases from 12.1 mA to 6.9 A due to the highly concentrated incident light. The ratio of $J_{se}$ to the light intensity ($J_{sc}$/intensity) is similar for both 1 sun (0.145 A/W) and 492 suns (0.148 A/W). The power conversion efficiency n reaches 37.8% for the AM1.5D spectrum under 492 suns.

The prototype CPV module 504 had a size of 47 mm×47 mm, within which twelve full-sized PV cells 306 and four half-sized cells 1004 were placed as shown in FIG. 10. Each of the full-sized PV cells 306 had dimensions of 9.5 mm×9.75 mm. Gaps of 1 mm between neighboring PV cell 306 provide space for wiring and placing thermocouples. As shown in FIG. 10, there are no PV cells 306 in the shadow area 1010 due to the shadow cast by the support arm 112 of FIGS. 1 and 2. The PV cells 306 were divided into four quadrants with three full-sized PV cells 306 and one half-sized PV cell 1004 in each quadrant connected in parallel. The four quadrants were wired in series, leaving the anode of quadrant 4 and the cathode of quadrant 1 as electrodes to extract electrical power from the prototype. With this wiring strategy, a 4-four increase in voltage and 3.5-fold increase in current is achieved.

Thermal Module—A prototype of the thermal module 502 was designed to prioritize simple and low-cost assembly, low energy loss, strong mechanical rigidity, and long lifetime. A prototype of the cooling block 604 was fabricated from two plates scaled together with a gasket. Internally, a 500 micron-deep serpentine path was machined into one of the plates, covering most cell areas. The size of the prototype cooling block 604 is similar to the prototype CPV module 504, and includes a notch 616 (see FIG. 6) for electrical wires. The prototype cooling block 604 was fabricated from 6061-T6 aluminum.

A prototype of the helical tube 602 was formed from 3003 annealed aluminum tubing with an outside diameter of 3.17 mm and a wall thickness of 0.64 mm. This tubing was hand-bent into a square helix, as shown in FIGS. 5-8. Aluminum brazing was used to fill gaps between adjacent turns. This brazing was performed on two opposing inner faces of the prototype helical tube 602 to increase structural integrity and mechanical robustness. Coated in Pyromark 2500, a highly absorptive black solar paint, the prototype helical tube 602 can absorb incident concentrated light with an absorptance of 95.0%. Several thermal insulation pieces 710 (Zircar RSLE-57) with low thermal conductivity of 0.55 W/m·K at 200° C. were placed between the prototype cooling block 604 and the prototype helical tube 602 to prevent the prototype CPV module 504 from being heated by the high temperatures of the prototype helical tube 602.

Pipes with an inner diameter of 1.9 mm and an outer diameter of 3.2 mm were connected between an inlet reservoir (not shown) and the inlet 802 of the prototype cooling block 604, and between the output tube 608 and an outlet reservoir (not shown). These pipes also serve as the exclusive structural supports for the entire hybrid receiver 110. Due to the length and small cross-section area of these pipes, thermal conduction between high-temperature components of the thermal module 502 and the pipes is decreased, minimizing energy loss. Thermal insulation was also wrapped around the outlet pipe to further minimize thermal loss.

The Wind Shroud—A square-shaped prototype of the shroud 506 was constructed of highly reflective (R>95%) optical-grade anodized aluminum sheet (Alanod MIRO 4400 GP). It acts as a secondary reflector to redirect scattered solar radiation and emitted thermal radiation back toward the helical tube 602. It also reduces thermal convection loss from the thermal module 502 to the environment due to wind, which can otherwise be a prominent loss mechanism when the exterior surface temperature of the helical tube 602 exceeds 200° C.

Modeling

Electrical Model—The performance of each PV cell 306 was numerically modeled according to the incident power under concentrated flux irradiation. With these numbers, the electrical output of the CPV module 504 was predicted based on the physical circuit configuration and Kirchhoff's laws. The solar input flux to the prototype CPV module 504 was assumed to be inhomogeneous, being calculated directly from flux maps at the plane of the PV cells 306. Power losses due to voltage mismatches inside each quadrant, current mismatches among the four quadrants, increased series resistance due to cell wiring, and shadowing from the silver wires were taken into account in this model.

Thermal Model—Finite element method (FEM) modeling with COMSOL was used to simulate the thermal performance of the cooling block 604 and the helical tube 602. In the cooling-block model, the twelve full-sized PV cells 306 and four half-sized PV cells 1004 were treated as heat sources. The heat power was calculated using the incident power on the CPV module 504, power loss due to optical reflection, and the efficiency of the CPV module 504 determined from the electrical model. Conditions like inlet temperature and mass flow rate were set to expected values for field operation.

Figure 12:
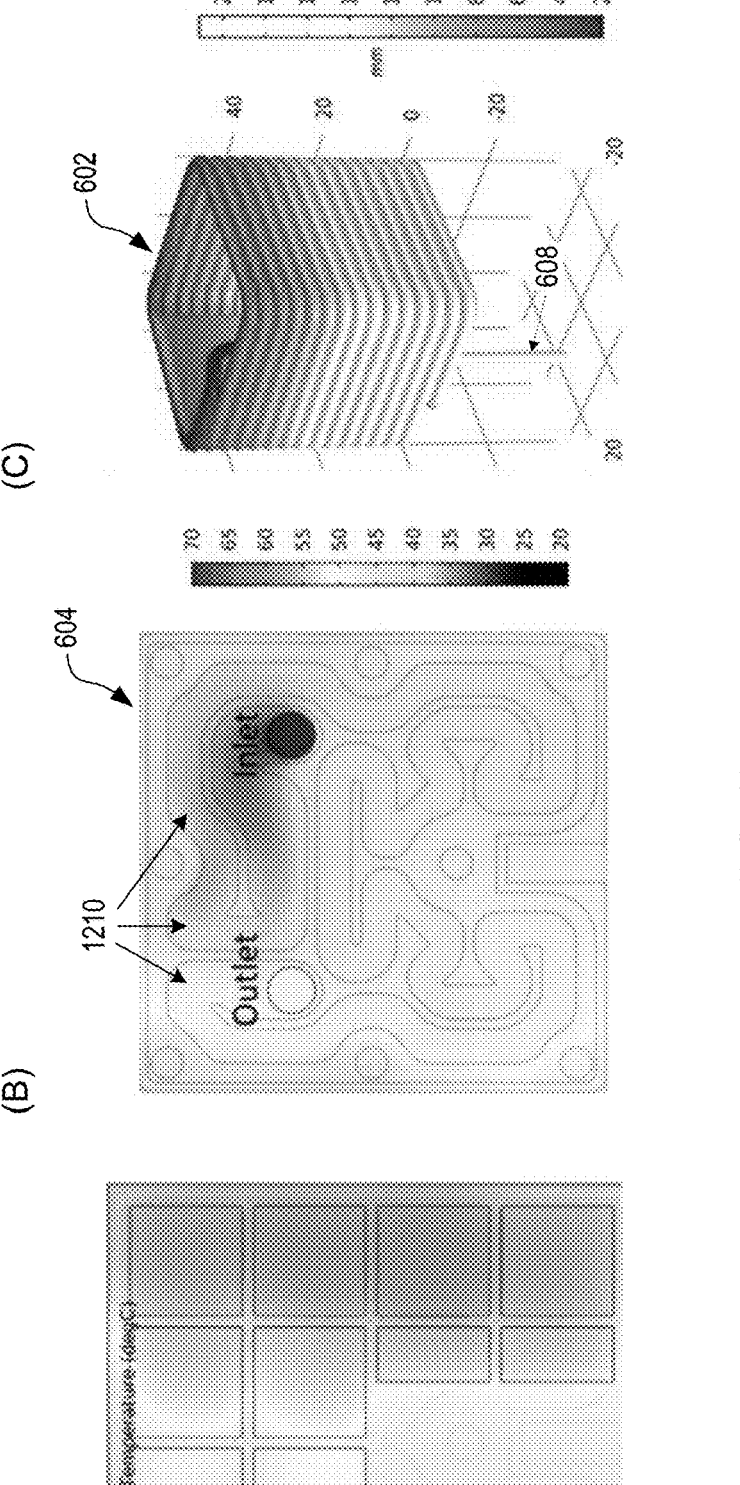
FIG. 12 shows exemplary temperature contour plots for a prototype CPV module, cooling block, and helical tube.

FIG. 12 shows exemplary temperature contour plots for the prototype CPV module 504 (see FIG. 12A), cooling block 604 (see FIG. 12B), and helical tube 602 (see FIG. 12C). The contour plots in FIG. 12 were obtain from the thermal model described above. The total power from the PV cells 306 as waste heat 312 was set to 258.4 W, which is the thermal load when the hybrid receiver is positioned 60 mm inboard from the focal plane 442 of the dish 102 (average concentration on the cells of 345 suns). For the heat transfer fluid, water was selected with a mass flow rate of 2 g/s and an initial temperature of 20° C. The simulation predicted a maximum temperature of 62.2° C. for the PV cells 306, and an outlet temperature of 49.3° C.

In the model of the prototype helical tube 602, the solar irradiation power of 1634.5 W was distributed uniformly on the outer surface. The black solar paint coating had a power emissivity of 0.92. Again, water with an initial temperature of 20° C. and mass flow rate was 2 g/s was used as the heat transfer fluid. Considering that the output temperature is expected to be high with non-negligible power loss, thermal radiation and convection losses were included for accuracy. As shown in FIG. 12C, the predicted temperature near the output tube 608 reaches 210.7° C. Radiation loss and convection loss together contribute 5% of the input power, which will be used for future performance evaluation.

In-Lab Characterization

Figure 13:
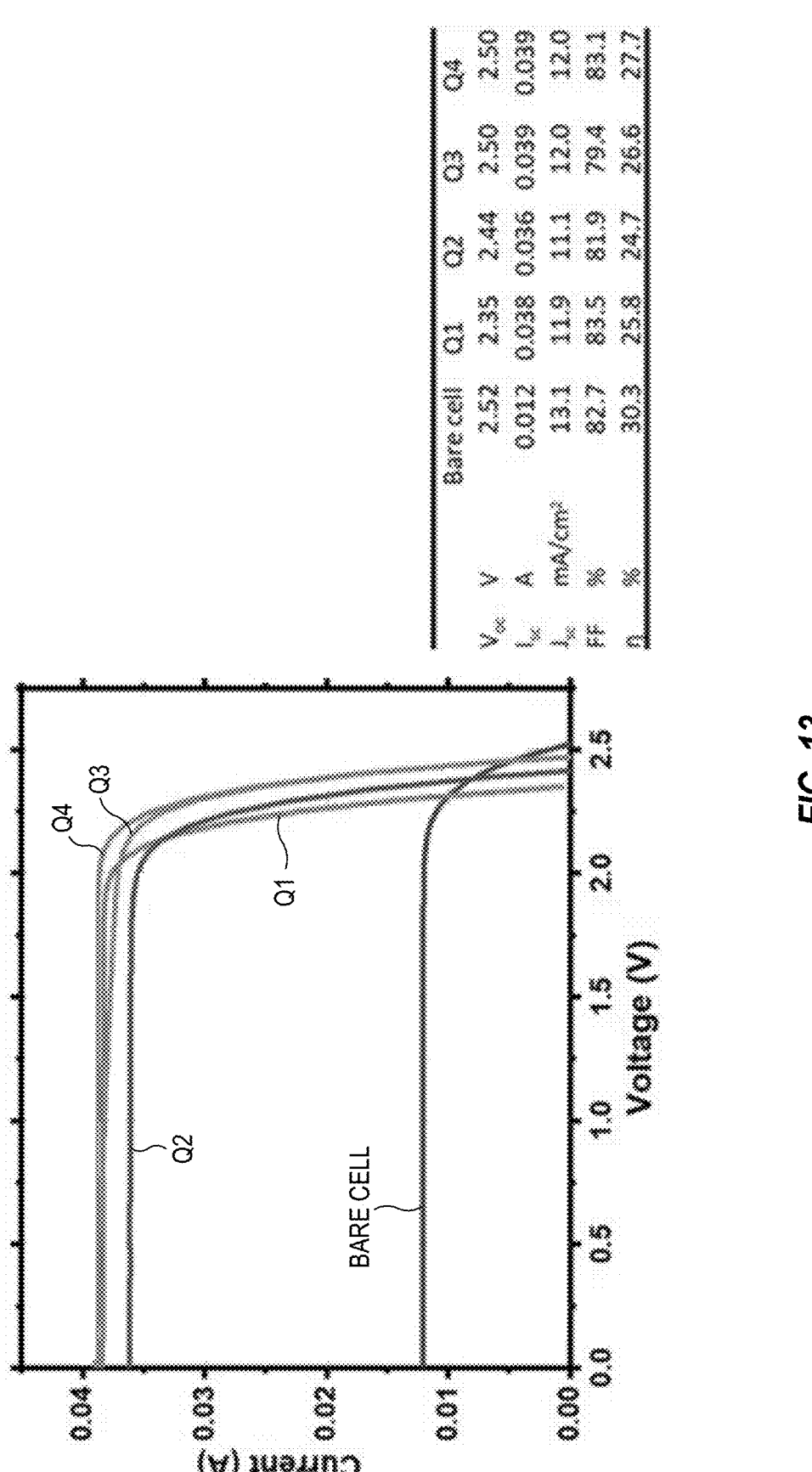
FIG. 13 shows exemplary current-voltage curves measured with a "bare" triple-junction PV cell and each of four quadrants of the prototype CPV module.

Electrical Characterization—FIG. 13 shows exemplary current-voltage curves measured with a "bare" triple-junction PV cell 306 and each of the four quadrants of the prototype CPV module 504. To obtain these curves, each of four quadrants was individually assembled and tested under one-sun illumination provided by a continuous, multi-zone solar simulator (Unisim, TS-Space System), with a total intensity of 0.09 W/cm$^2$. The bare SolAero triple-junction PV cell 306 was tested similarly. The table in FIG. 13 lists the physical parameters for the one-sun tests. Since each quadrant contains 3.5 cells in parallel, a 3.5-fold increase in $I_{sc}$ was expected for each of the quadrants, as compared to the bare PV cell 306. However, due to the shadowing from silver wires 1002, only a 3.2-fold increase in $I_{sc}$ was observed. All four quadrants show a decreased $V_{oc}$, which results from the series resistance of the silver wires 1002.

Figure 14:
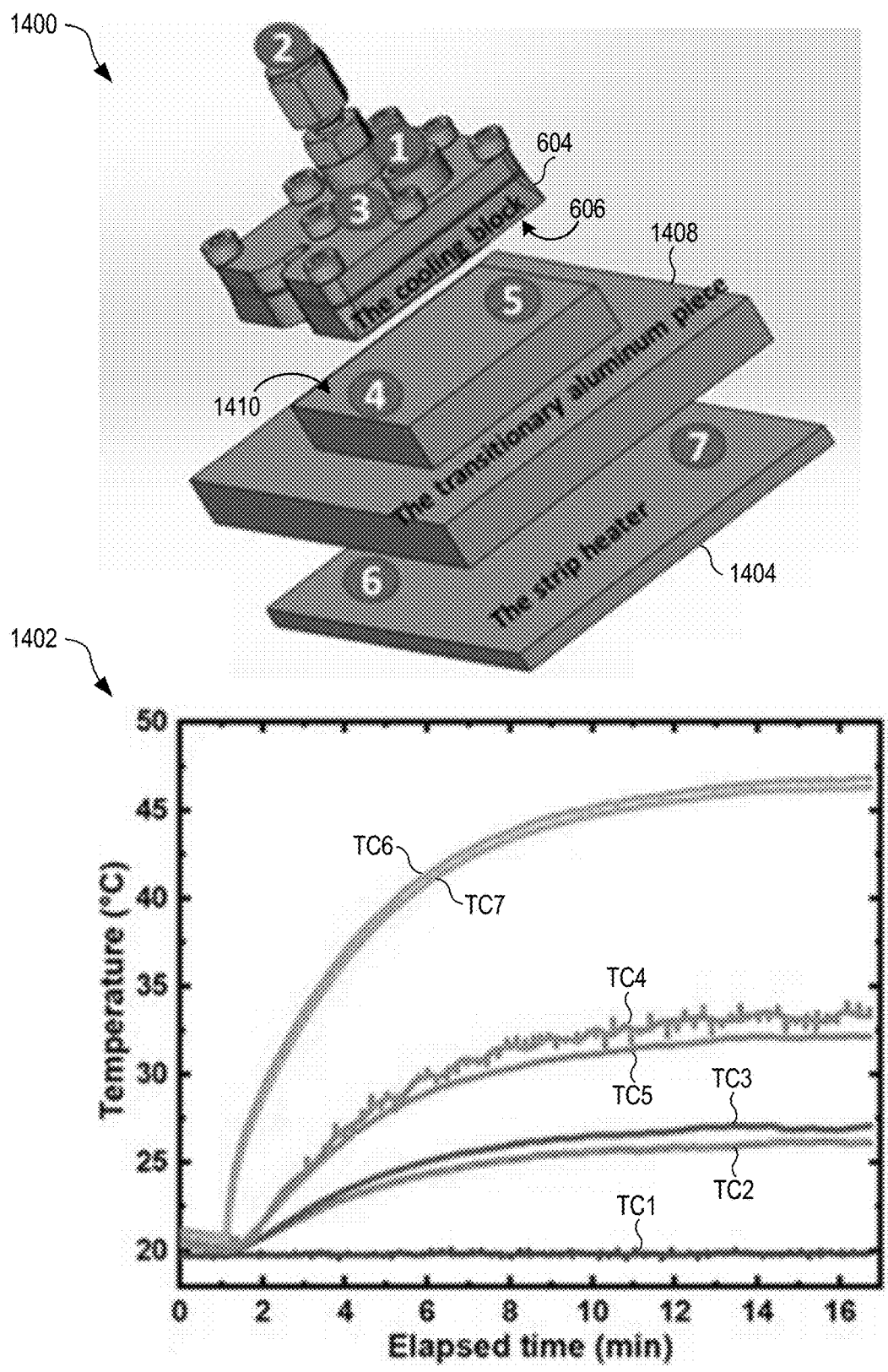
FIG. 14 shows an exemplary setup and results for tests of the prototype cooling block.

Thermal Characterization—FIG. 14 shows an exemplary setup 1400 and results 1402 for tests of the prototype cooling block 604. As shown in the setup 1400, heat-transfer putty was used to affix a strip heater 1404 to the back side of an intermediate transitionary aluminum piece 1408. A front side 1410 of the aluminum piece 1408 acts as the bottom face 922 of the CPV module 504 (see FIG. 9) and is placed in direct contact with the top face 606 of the prototype cooling block 604. Seven thermocouples (TCs) were positioned at various interfaces, as well as in the inlet (TC1) and outlet (TC2) of the cooling block 604. The positions of the seven TCs are identified in FIG. 14 by numbers 1 through 7. The setup 1400 was then wrapped tightly with mineral wool insulation to reduce heat loss. Room-temperature water flowed through the cooling block 604 and the strip heater 1404 was set to output 57 W of heat power. Water from the outlet was weighed every 60 seconds to ensure adherence to the desired mass flow rate. The TC temperatures were displayed and recorded on a computer that was connected to an eight-channel datalogger. The results 1402 show measured TC temperatures as a function of elapsed time during the test. Tests were conducted for mass flow rates of 1 g/s, 2 g/s, and 3 g/s. The results 1402 are for the test at 2 g/s.

Figure 15:
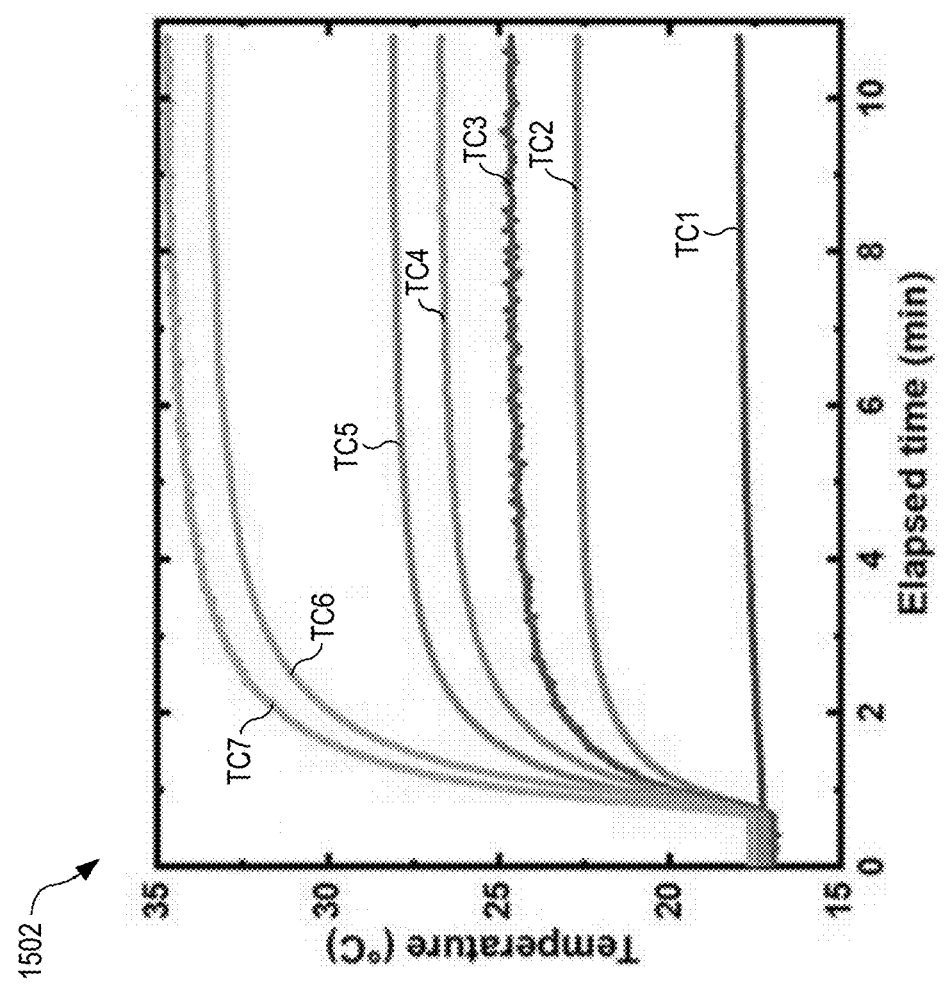
FIG. 15 shows an exemplary setup and results for tests of the prototype helical tube.
Figure 15:
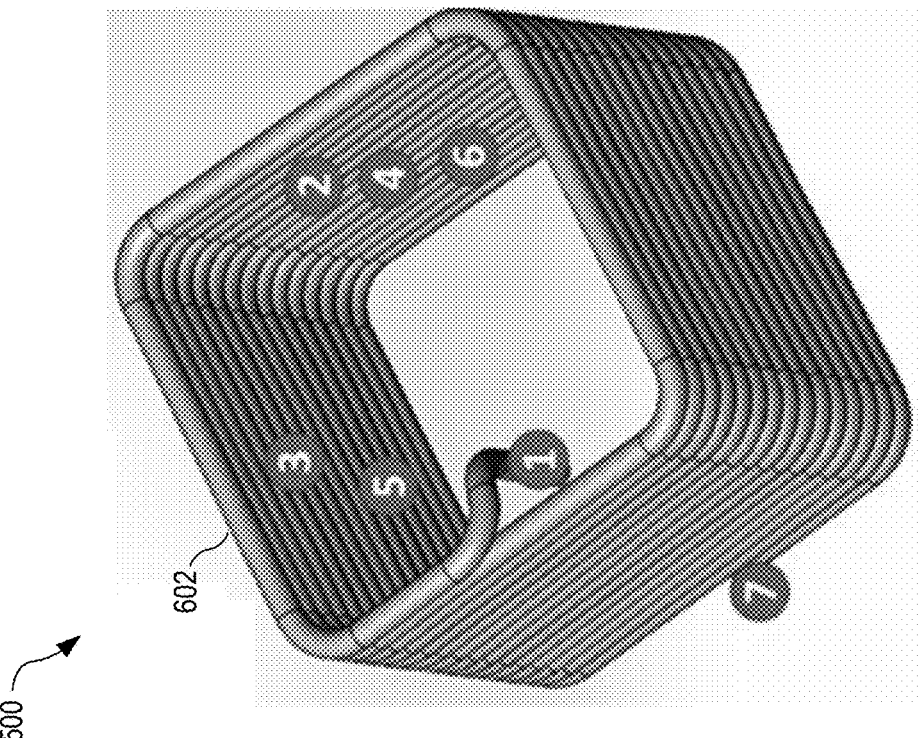

FIG. 15 shows an exemplary setup 1500 and results 1502 for tests of the prototype helical tube 602. Thermally conductive epoxy adhesive (3M TC-2707) was used to affix seven K-type thermocouples (TCs) to the helical tube 602 at the locations labeled 1 through 7 in FIG. 15. A silicone heating pad was then wrapped around the helical tube 602, again using heat transfer putty to ensure reliable thermal contact. Thermal insulation was set up with mineral wool to avoid energy losses. Room-temperature water flowed through the helical tube 602 at flow rates between 1 g/s and 3 g/s while the silicone heating pad applied thermal energy (230 W, 113 W, 59 W) to the helical tube 602. The results 1502 show measured TC temperatures as a function of time with water flowing at 3 g/s mass flow rate and an input power of 230 W. As expected, the temperature increases along the flow direction (top to bottom). Additional tests were conducted with different power inputs and mass flow rates.

Figure 16:
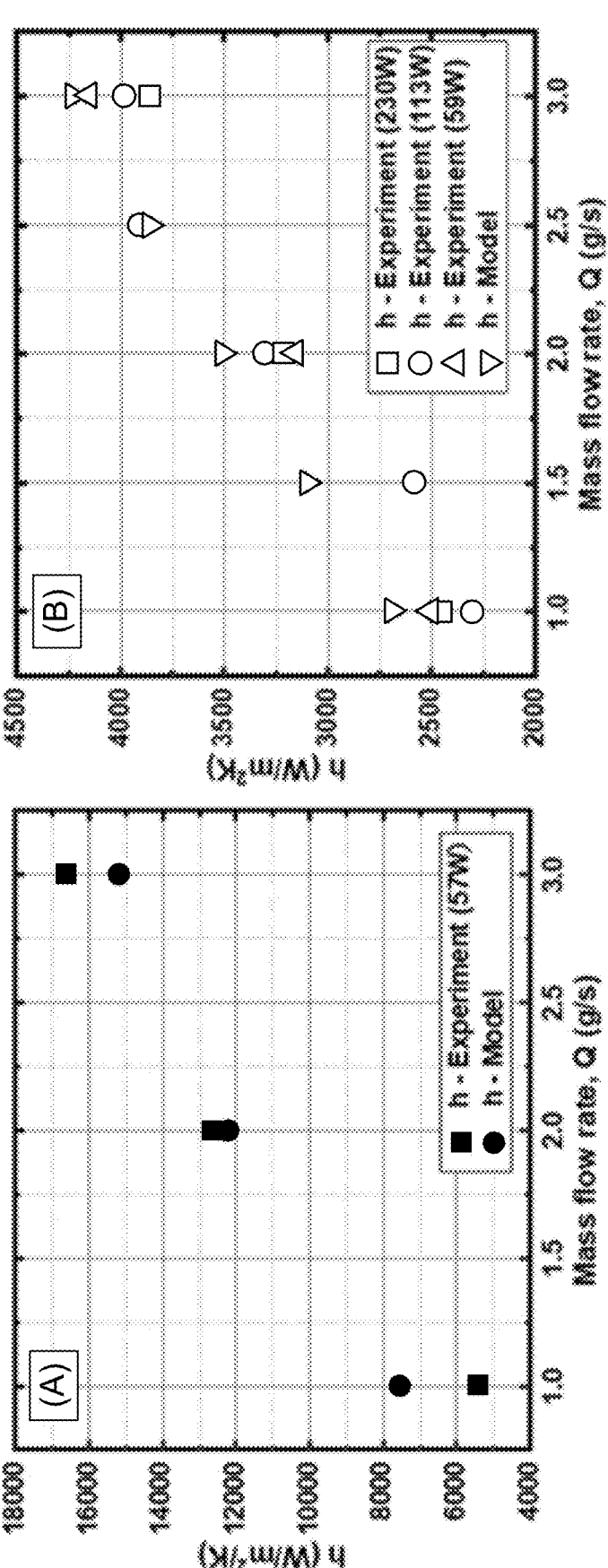
FIG. 16 shows exemplary plots of a convective heat transfer coefficient h as a function of mass flow rate for the cooling block and the helical tube.

FIG. 16 shows exemplary plots of a convective heat transfer coefficient h as a function of mass flow rate for (A) the cooling block 604, and (B) the helical tube 602. The experimental values of h were obtained from the geometrical parameters of the fluid channel and the measured temperatures. The modeled values of h were calculated from results of the COMSOL simulation with the same boundary conditions. The experimental and modeled values of h agree, showing the expected linear relationship with the mass flow rate. These results verify that the water used as the heat transfer fluid is laminar in this region. The helical tube 602 performs similarly to the cooling block 604, but with smaller values of h, in agreement with the design (i.e., the smaller the cooling channels, the larger the values of h).

Figure 17:
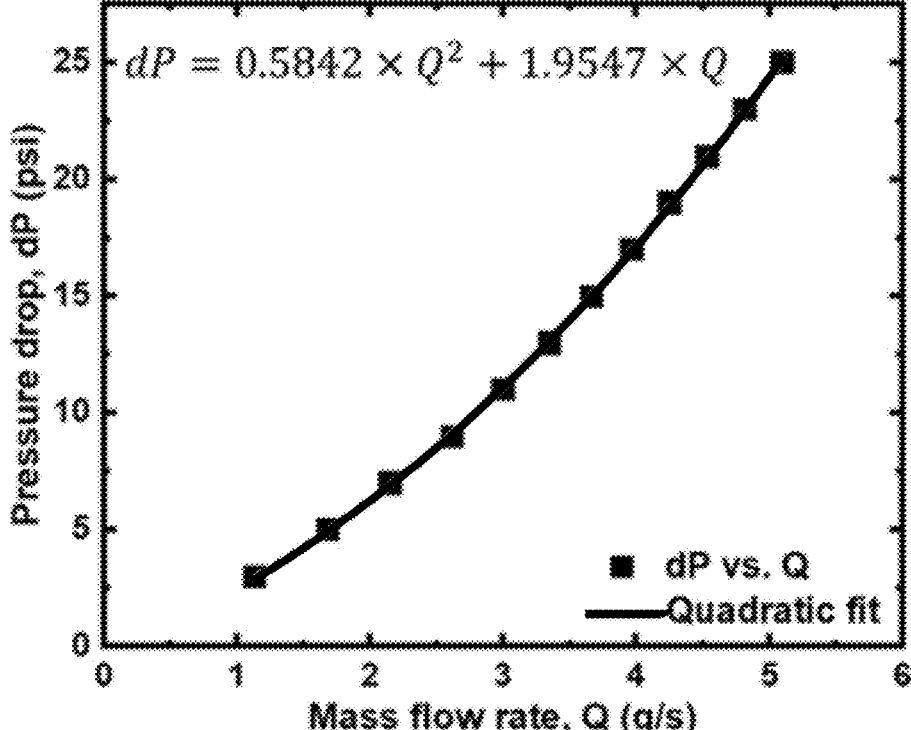
FIG. 17 shows an exemplary plot of pressure drop as a function of mass-flow rate.

Fluid Flow Characterization—FIG. 17 shows an exemplary plot of pressure drop as a function of mass-flow rate. After mounting the prototype cooling block 604 and helical tube 602 together to form a prototype thermal module 502, gravimetric analysis was used to characterize the relationship between mass flow rates and applied pressures to the water in the prototype thermal module 502. The thermal module 502 was positioned approximately six feet above a water pump to simulate the hydraulic head experienced when installed on the solar tracker. Using a pressure regulator, the water pressure was set to a discrete integer value. All outflow was collected in a reservoir and weighed every 60 seconds for 10 minutes. The average weight for all intervals was then calculated and converted to mass. This process was repeated for additional increasing integer pressure values, with the complete range of tested pressure values stretching from 3 to 25 psi. The data points in FIG. 17 are the measured values of the pressure drop, which are well-fit to a quadratic line, representing non-laminar flow in the integrated thermal module. This may result from stagnant water in channel corners in the cooling block, or turbulent flow in some tube bending areas and piping connection ports.

Submerged Static Pressurization Test—To confirm the ability of the prototype thermal module 502 to contain the pressure necessary to confine the water to the liquid phase while operating at output temperatures exceeding 200° C., the outlet 806 was sealed and the inlet 802 was connected to pressurized argon gas. The tank valve was closed after pressurizing the thermal module 502 to 400 psi. The thermal module 502 was submerged in water for 5 minutes to check for gas leaks. No bubbles or decrease in pressure was detected.

Outdoor Performance Prediction

Flux maps were measured and analyzed to identify the power distribution on both the prototype CPV module 504 and the prototype thermal module 502. According to the electrical model, the electric power output and the thermal load can be calculated. The thermal load from each PV cell 306 was then imported to the COMSOL cooling-block model to predict the PV cell temperature and water temperature when it exits the cooling block 604. After setting the power incident onto the helical tube 602 as the input power and the exit water temperature from the cooling block 604 as the inlet temperature in the COMSOL thermal-coil model, the final output water temperature was predicted.

Solar Flux Analysis—FIG. 18 shows an exemplary flux map measured for a dish and tracker that may be used to test the prototype hybrid receiver 110. The flux map was measured at a position 63.5 mm from the focal plane in the direction toward the dish (i.e., inboard). As shown in FIG. 18, the direct normal irradiance (DNI) was only 800 W/m$^2$ and the total power was 1973 W, as measured with a pyrheliometer mounted on the tracker. The flux distribution in the flux map has been scaled up to a normal DNI of 900 W/m$^2$, with a total power of 2220 W from the dish, for the following models. Additional flux maps at 45, 50, 55, 60, 65, 70, 75, and 80 mm were also obtained by the triangular projection method, assuming the rays converge towards the focal point.

MATLAB code was used to analyze the flux maps using the DNI number and the known diameter of the pyrheliometer. With the flux density and power for each pixel in the image calculated from the MATLAB code, the incident power on the prototype CPV module 504 and each PV cell 306 was obtained by integrating the power flux over the corresponding areas. In FIG. 18, the CPV module 504 is not fully overlaid on the flux map, leaving a large fraction of the incident power to reach the helical tube 602.

FIG. 19 shows an exemplary plot of solar power incident on the CPV module 504 and the helical tube 602 as a function of cell-plane distance inboard from the focal plane 442 of the dish 102. At 45 mm, the incident light is almost split equally between the CPV module 504 and the thermal module 502. Along the direction closer to the dish 102 (i.e., away from the focal plane 442), the power on the helical tube 602 increases since the flux area increases, with less sunlight being incident on the CPV module 504.

Predicted Outdoor Performance—FIG. 20 shows exemplary plots of predicted performance of the prototype hybrid receiver 110. The flux density and power on each PV cell 306 from the flux map analysis was inputted to the electrical model discussed above. The model predicts electric power from the CPV module 504. This process was conducted multiple times for each position of the CPV module 504 relative to the focal plane 442 of the concentrator dish 102. FIG. 20A shows the predicted electric power as a function of distance from the focal plane 442. It shows the same trend as the helical tube 602 in FIG. 19. The efficiency of the CPV module 504 is between 29.8% and 32.1%. Voltage and current mismatch is the largest source of lost power, corresponding to almost 3% of the power incident on the PV cells 306.

PV-cell temperature was investigated using the above-mentioned thermal model. It is required that the temperatures of the PV cells 306 never exceed the upper limit operating temperature of the CPV module 504, usually around 110° C. FIG. 20B shows the predicted maximum cell temperature for mass flow rates of 1 g/s, 2 g/s, and 3 g/s. The PV cells 306 are cooler at higher mass flow rate, as expected, because the convective heat transfer coefficient increases linearly with the mass-flow rate, as described above. All points except for that at 45 mm and 1 g/s are below 110° C.

The output temperature from the thermal module 502 was also investigated using the above-mentioned thermal model. For wider applications of process heat in industry or commercial use, an output temperature larger than 120° C. may be preferred. FIG. 20C shows the output temperature as a function of the distance from the focal plane for three mass flow rates. The final output temperature is largely impacted by the mass flow rate, not position relative to the focal plane. The water absorbs both waste heat 312 from the CPV module 504 and the solar power striking the outer surface of the helical tube 602. Even though more power is absorbed by the helical tube 602 as the CPV module 504 is moved away from the focal plane 442, the lower exit temperature of the cooling block 604 (and corresponding input temperature to the helical tube 602) compensates the temperature difference among different cell operating planes. The operating parameters used in the thermal model all result in an output temperature greater than 120° C. The model predicts a 94.6% efficiency of the helical tube 602 for an operating plane of 63.5 mm and a mass flow rate of 2 g/s.

FIG. 21 is a table listing predicted electrical and thermal energies generated by the prototype hybrid receiver 110 when operating at different distances between the CPV module 504 and the focal plane 442. The data in FIG. 21 was obtained assuming a mass flow rate of 2 g/s. The electrical energy and thermal energy are adjustable by moving the hybrid receiver 110 closer to or further away from the focal plane. The CPVT efficiency is obtained by adding the energy fractions of electric power and thermal power. The CPVT efficiency is larger when the hybrid receiver is positioned farther from the focal plane 442, as expected since the thermal absorption efficiency in the thermal module 502 increases faster than the electrical conversion efficiency in the CPV module 504 decreases.

Combination of Features

Features described above as well as those claimed below may be combined in various ways without departing from the scope hereof. The following examples illustrate possible, non-limiting combinations of features and embodiments described above. It should be clear that other changes and modifications may be made to the present embodiments without departing from the spirit and scope of this invention:

(A1) A hybrid receiver may include a concentrator photovoltaic module having a heat transfer plate and an array of photovoltaic cells thermally coupled to the heat transfer plate. The hybrid receiver may include a thermal module having a cooling block forming an internal path through which heat transfer fluid can flow. A bottom face of the heat transfer plate may be in direct thermal contact with a top face of the cooling block. The thermal module may have a helical tube surrounding the cooling block and connected to the cooling block such that the heat transfer fluid flows through the helical tube after flowing through the cooling block.

(A2) In the hybrid receiver denoted (A1), the hybrid receiver may include a reflective shroud surrounding the concentrator photovoltaic module and the thermal module. The reflective shroud may be shaped to reflect thermal radiation and scattered light from the thermal module onto the helical tube.

(A3) In the hybrid receiver denoted (A2), the reflective shroud may be made of aluminum.

(A4) In any one of the hybrid receivers denoted (A1) to (A3), the hybrid receiver may include an inlet pipe connected to a rear face of the cooling block, and an outlet pipe connected to an output port of the helical tube. The inlet pipe may mechanically support the thermal module and the concentrator photovoltaic module.

(A5) In any one of the hybrid receivers denoted (A1) to (A4), the hybrid receiver may include a plurality of thermally insulating spacers positioned between the cooling block and the helical tube.

(A6) In any one of the hybrid receivers denoted (A1) to (A5), the hybrid receiver may include an absorptive coating on the helical tube.

(A7) In any one of the hybrid receivers denoted (A1) to (A6), the heat transfer plate may be made of an electrically insulating material.

(A8) In the hybrid receiver denoted (A7), the electrically insulating material may be alumina.

(A9) In any one of the hybrid receivers denoted (A1) to (A8), all of the bottom face of the heat transfer plate may be in direct thermal contact with the top face of the cooling block.

(A10) In any one of the hybrid receivers denoted (A1) to (A9), the helical tube may form either a square helix or a circular helix.

(A11) In any one of the hybrid receivers denoted (A1) to (A10), each of the array of photovoltaic cells may be a III-V multi-junction cell.

(A12) In any one of the hybrid receivers denoted (A1) to (A11), the concentrator photovoltaic module may include an electrically conductive backing sheet, electrical adhesive bonding a rear face of each of the array of photovoltaic cells to the backing sheet, and thermal adhesive bonding the backing sheet to a top face of the heat transfer plate.

(A13) In the hybrid receiver denoted (A12), the backing sheet may be made of silver.

(A14) In any one of the hybrid receivers denoted (A1) to (A13), the hybrid receiver may include a superstrate window positioned over the array of photovoltaic cells, and an encapsulant joining a front face of each of the array of photovoltaic cells with a bottom face of the superstrate window.

(A15) In any one of the hybrid receivers denoted (A1) to (A14), the internal path may be sized such that heat transfer fluid flows through the internal path as a microfluid.

(A16) In any one of the hybrid receivers denoted (A1) to (A15), the internal path may have a depth of 500 μm or less.

(B1) A concentrator photovoltaic-thermal power system may include any one of the hybrid receivers denoted (A1) to (A16), a concentrator mirror, and a solar tracker with a support arm affixed to the hybrid receiver and positioning the hybrid receiver such that the concentrator photovoltaic module faces the concentrator mirror.

(B2) In the concentrator photovoltaic-thermal power system denoted (B1), the support arm may position the hybrid receiver such that the concentrator photovoltaic module is between the concentrator mirror and a focal plane of the concentrator mirror.

(C1) A method for concentrated photovoltaic-thermal power generation may include converting a first portion of concentrated sunlight into electrical power when the first portion of concentrated sunlight illuminates an array of photovoltaic cells, thermally coupling heat generated by the photovoltaic cells into a heat transfer plate, cooling the heat transfer plate by flowing heat transfer fluid through an internal path of a cooling block in direct thermal contact with the heat transfer plate, and flowing the heat transfer fluid through the helical tube to absorb thermal energy from a second portion of concentrated sunlight illuminating the helical tube.

(C2) In the method denoted (C1), the method may include reflecting thermal radiation and scattered light from the thermal module onto the helical tube.

(C3) In the method denoted (C2), said reflecting may be performed with a reflective shroud surrounding the helical tube, cooling block, heat transfer plate, and array of photovoltaic cells.

(C4) In the method denoted (C3), the method may include blocking wind from the helical tube and cooling block with the reflective shroud.

(C5) In any one of the methods denoted (C1) to (C4), the method may include supplying the heat transfer fluid to the cooling block via an inlet pipe connected to a rear face of the cooling block, and receiving the heat transfer fluid from the helical tube with an outlet pipe. The method may also include mechanically supporting the helical tube, cooling block, heat transfer plate, and array of photovoltaic cells with the inlet pipe.

(C6) In any one of the methods denoted (C1) to (C5), the method may include thermally isolating the cooling block from the helical tube with a plurality of thermally insulating spacers.

(C7) In any one of the methods denoted (C1) to (C6), the method may include positioning the array of photovoltaic cells, heat transfer plate, cooling block, and helical tube to adjust a ratio of electrical power generated by the array of photovoltaic cells and thermal power outputted by the heat transfer fluid.

(C8) In any one of the methods denoted (C1) to (C7), the heat transfer fluid may flow through the helical coil after the cooling block such that an average temperature of the heat transfer fluid, when exiting the helical coil, is greater than a maximum temperature of the photovoltaic cells.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

We claim:

1. A method for concentrated photovoltaic-thermal power generation, comprising:

converting a first portion of concentrated sunlight into electrical power when the first portion of concentrated sunlight illuminates an array of photovoltaic cells;

absorbing heat from the photovoltaic cells with a heat transfer plate;

cooling the heat transfer plate by flowing heat transfer fluid through an internal path of a cooling block in direct thermal contact with the heat transfer plate; and subsequently flowing the heat transfer fluid through a helical tube to absorb thermal energy from a second portion of concentrated sunlight illuminating the helical tube.

2. The method of claim 1, further comprising reflecting thermal radiation and scattered light from a thermal module onto the helical tube.

3. The method of claim 2, wherein said reflecting is performed with a reflective shroud surrounding the helical tube, the cooling block, the heat transfer plate, and the array of photovoltaic cells.

4. The method of claim 3, further comprising blocking wind from the helical tube and cooling block with the reflective shroud.

5. The method of claim 1, further comprising:

supplying the heat transfer fluid to the cooling block via an inlet pipe connected to a rear face of the cooling block;

receiving the heat transfer fluid from the helical tube with an outlet pipe; and mechanically supporting the helical tube, cooling block, heat transfer plate, and array of photovoltaic cells with the inlet pipe.

6. The method of claim 1, further comprising thermally isolating the cooling block from the helical tube with a plurality of thermally insulating spacers.

7. The method of claim 1, further comprising positioning the array of photovoltaic cells, heat transfer plate, cooling block, and helical tube to adjust a ratio of electrical power generated by the array of photovoltaic cells and thermal power outputted by the heat transfer fluid.

8. The method of claim 1, wherein an average temperature of the heat transfer fluid, when exiting the helical tube, is greater than a maximum temperature of the photovoltaic cells.

* * * * *

18